(12) United States Patent
Kato et al.

(10) Patent No.: US 9,534,144 B2
(45) Date of Patent: Jan. 3, 2017

(54) FILM-FORMING COMPOSITION

(71) Applicant: NISSAN CHEMICAL INDUSTRIES, LTD., Tokyo (JP)

(72) Inventors: Taku Kato, Funabashi (JP); Natsumi Murakami, Sodegaura (JP); Yoshinari Koyama, Sodegaura (JP); Naoya Nishimura, Funabashi (JP); Masaaki Ozawa, Funabashi (JP)

(73) Assignee: NISSAN CHEMICAL INDUSTRIES, LTD., Tokyo (JP)

(*) Notice: Subject to any disclaimer, the term of this patent is extended or adjusted under 35 U.S.C. 154(b) by 0 days.

(21) Appl. No.: 14/755,872

(22) Filed: Jun. 30, 2015

(65) Prior Publication Data

US 2015/0299512 A1 Oct. 22, 2015

Related U.S. Application Data

(62) Division of application No. 13/818,546, filed as application No. PCT/JP2011/068935 on Aug. 23, 2011, now Pat. No. 9,243,165.

(30) Foreign Application Priority Data

Aug. 25, 2010 (JP) ................... 2010-187764

(51) Int. Cl.
| | | |
|---|---|---|
| C08K 9/00 | (2006.01) |
| C09D 179/02 | (2006.01) |
| C08G 73/02 | (2006.01) |
| C08G 73/06 | (2006.01) |
| C09D 179/04 | (2006.01) |
| C09D 201/00 | (2006.01) |
| H01L 31/0232 | (2014.01) |
| C08K 3/22 | (2006.01) |

(52) U.S. Cl.
CPC .......... *C09D 179/02* (2013.01); *C08G 73/026* (2013.01); *C08G 73/0273* (2013.01); *C08G 73/0644* (2013.01); *C08K 3/22* (2013.01); *C09D 179/04* (2013.01); *C09D 201/005* (2013.01); *H01L 31/02327* (2013.01); *C08K 2003/2231* (2013.01); *C08K 2003/2241* (2013.01); *C08K 2003/2244* (2013.01)

(58) Field of Classification Search
CPC .............................. C09D 179/02; C09D 179/04
See application file for complete search history.

(56) References Cited

U.S. PATENT DOCUMENTS

| | | | |
|---|---|---|---|
| 8,618,243 B2 | 12/2013 | Nishimura et al. |
| 2004/0254275 A1 | 12/2004 | Fukui et al. |
| 2009/0287015 A1 | 11/2009 | Biteau et al. |
| 2009/0318725 A1 | 12/2009 | Takeuchi |
| 2013/0154043 A1* | 6/2013 | Kato .................... C08G 73/026 257/432 |

FOREIGN PATENT DOCUMENTS

| | | |
|---|---|---|
| CN | 101643651 A | 2/2010 |
| EP | 1975192 A1 | 10/2008 |
| JP | 7-113009 A | 5/1995 |
| JP | 2001-354853 A | 12/2001 |
| JP | 2004-315716 A | 11/2004 |
| JP | 2007-246877 A | 9/2007 |
| JP | 2008-24832 A | 2/2008 |
| JP | 2008-169318 A | 7/2008 |
| JP | 2008-174602 A | 7/2008 |
| JP | 2009-67933 A | 4/2009 |

OTHER PUBLICATIONS

Extended European Search Report dated Apr. 23, 2014 for European Application No. 11819914.0.
Mahapatra et al., "Effect of structure and concentration of polymer, metal ion and pH of the medium on the fluorescence characteristics of hyperbranched polyamines," Journal of Luminescence, vol. 128, No. 12, Dec. 2008 (Available online: Jun. 1, 2008), pp. 1917-1921, XP025409876.
Mahapatra et al., "Fluorescent Hyperbranched Polyamine with s-Triazine: Synthesis, Characterization and Properties Evaluation," Polymer Journal, vol. 41, No. 1, 2009, pp. 20-25, XP055109810.
Mahapatra et al., "Hyperbranched Aromatic Polyamines with s-Triazine Rings", Journal of Applied Polymer Science, vol. 106, pp. 95-102, 2007.

(Continued)

*Primary Examiner* — Hannah Pak
(74) *Attorney, Agent, or Firm* — Birch, Stewart, Kolasch & Birch, LLP

(57) ABSTRACT

A film-forming composition including a triazine ring-containing hyperbranched polymer with a repeating unit structure indicated by formula (1), and inorganic micro particles is provided. This enables the provision of a film-forming composition capable of hybridizing without reducing dispersion of the inorganic micro particles in a dispersion fluid, capable of depositing a coating film with a high refractive index, and suitable for electronic device film formation.

(1)

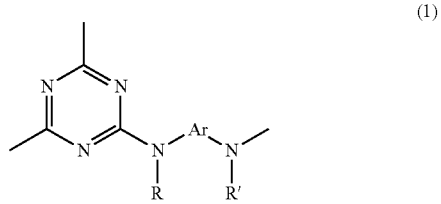

In the formula, R and R' are mutually independent and indicate a hydrogen atom, an alkyl group, an alkoxy group, an aryl group, or an aralkyl group, and Ar indicates a divalent organic group including either an aromatic ring or a heterocyclic ring, or both.

11 Claims, 6 Drawing Sheets

(56) References Cited

OTHER PUBLICATIONS

Takagi et al., "Triazine Dendrimers by Divergent and Convergent Methods," Journal of Polymer Science Part A: Polymer Chemistry, vol. 38, No. 24, 2000 (Published online: Oct. 31, 2000), pp. 4385-4395, XP009166061.

Zhang et al., "Structure-Activity Relationships in Dendrimers Based on Triazines: Gelation Depends on Choice of Linking and Surface Groups," Macromolecules, vol. 35, No. 24, 2002 (Published online: Oct. 15, 2002), pp. 9015-9021, XP055085420.

Mahapatra et al., "Silver nanoparticle in hyperbranched polyamine: Synthesis, characterization and antibacterial activity," Materials Chemistry and Physics, vol. 112, 2008, pp. 1114-1119.

\* cited by examiner

FILM-FORMING COMPOSITION

CROSS REFERENCE TO RELATED APPLICATIONS

This application is a Divisional of application Ser. No. 13/818,546, filed on Feb. 22, 2013, now U.S. Pat. No. 9,243,165. Application Ser. No. 13/818,546 is the U.S. national phase of International Application PCT/JP2011/068935, filed on Aug. 23, 2011. The benefit under 35 U.S.C. §119(a) is claimed to Japanese Patent Application No. 2010-187764, filed in Japan on Aug. 25, 2010. All of the foregoing applications are hereby expressly incorporated by reference into the present application.

TECHNICAL FIELD

The present invention relates to a film-forming composition. More specifically, the invention relates to a film-forming composition which includes a triazine ring-containing hyperbranched polymer and inorganic fine particles.

BACKGROUND ART

Various efforts have hitherto been made to increase the functionality of polymeric compounds. For example, in one approach currently used to increase the refractive index of polymeric compounds, aromatic rings, halogen atoms or sulfur atoms are introduced onto the compound. Of such compounds, episulfide polymeric compounds and thiourethane polymeric compounds, both of which have sulfur atoms introduced thereon, are in practical use today as high-refractive index lenses for eyeglasses.

However, given that material design to a refractive index above 1.7 is difficult with a polymer alone, the most effective method for achieving an even higher refractive index is known to involve the use of inorganic fine particles.

This method is a technique for achieving a higher refractive index by mixing together a polymer and inorganic fine particles. The mixing method generally entails mixing a polymer solution, with a dispersion of inorganic fine particles, in which case the polymer serves as a binder which stabilizes and keeps the dispersion of inorganic fine particles from breaking down.

It has been reported that polysiloxanes and polyimides can be used as the binder polymer.

For example, a method for increasing the refractive index by using a hybrid material composed of a polysiloxane mixed with a material containing a dispersed inorganic oxide such as zirconia or titania has been disclosed (Patent Document 1).

A method for increasing the refractive index by using a hybrid material composed of a polyimide mixed with an inorganic oxide or sulfide material containing dispersed titania, zinc sulfide or the like has also been disclosed (Patent Document 2).

These hybrid materials have been modified in various ways to increase the refractive index. However, when the refractive index of the binder polymer and the refractive index of the inorganic fine particles are compared, the refractive index of the inorganic fine particles is generally higher.

Hence, an effective way for increasing the refractive index of the hybrid material even further would be to increase the refractive index of the lower refractive index component; i.e., the binder polymer.

This has led to the disclosure of, for example, a method for introducing condensed ring structures having a high refractive index onto portions of the polysiloxane (Patent Document 3), and a method for introducing sites that increase the electron density onto portions of the polyimide (Patent Document 4).

However, even in such binder polymers that have been modified to increase the refractive index, the refractive index is currently about 1.6 to 1.7, which is still lower than that of inorganic fine particles, which have refractive indices of about 1.8 to 2.1.

Hence, further increasing the refractive index of the binder polymer to more than 1.7 is an important element for achieving a higher refractive index in hybrid materials.

In recent years, there has arisen a need for high-performance polymeric materials in the development of electronic devices such as liquid-crystal displays, organic electroluminescent (EL) displays, optical semiconductor (LED) devices, solid-state image sensors, organic thin-film solar cells, dye-sensitized solar cells and organic thin-film transistors (TFT).

The specific properties desired in such polymeric materials include (1) heat resistance, (2) transparency, (3) high refractive index, (4) high solubility, and (5) low volume shrinkage.

However, because the high refractive index lens materials for eyeglasses mentioned above generally have a poor heat resistance, requiring that production be carried out in a temperature range no higher than 200° C., materials of this type are unsuitable for processes such as baking in open air at 300° C.

Moreover, because polymeric compounds in which aromatic rings or triazine rings have been introduced generally have an inadequate solubility in solvents, they are insoluble in resist solvents which are safe solvents. On the other hand, materials which exhibit a high solubility generally have a low transparency.

Although triazine ring-containing hyperbranched polymers synthesized as polymers for use as flame retardants have been reported in the literature (Non-Patent Document 1), there are no reports of such hyperbranched polymers being hybridized with inorganic fine particles to form compositions.

As used herein, "hyperbranched polymer" refers to a highly branched polymer with an irregular branched structure that is obtained by, for example, polymerizing ABx-type polyfunctional monomers (where A and B represent functional groups that react with each other, and "x" on B is a number equal to 2 or more). Highly branched polymers include also the polymers having a regular branched structure that are referred to as "dendrimers." However, hyperbranched polymers are characterized by being easier to synthesize than dendrimers, and by the ease with which high-molecular-weight bodies can be synthesized.

PRIOR ART DOCUMENTS

Patent Documents

Patent Document 1: JP-A 2007-246877
Patent Document 2: JP-A 2001-354853
Patent Document 3: JP-A 2008-24832
Patent Document 4: JP-A 2008-169318

Non-Patent Documents

Non-Patent Document 1: Journal of Applied Polymer Science, 1006, 95-102 (2007)

SUMMARY OF THE INVENTION

Problems to be Solved by the Invention

It is therefore an object of the present invention to provide a film-forming composition that is highly suitable for the production of films for electronic devices, which composition is capable of hybridizing without reducing the dispersibility of inorganic fine particles within a dispersion and moreover is able to form a high refractive index film.

Means for Solving the Problems

The inventors earlier discovered that hyperbranched polymers containing recurring units which include a triazine ring and an aromatic ring have a refractive index above 1.7, are able with the polymer alone to achieve a high heat resistance, high transparency, high refractive index, high solubility and low volume shrinkage, and are thus suitable as film-forming compositions in the fabrication of electronic devices (International Application PCT/JP 2010/057761).

Based on these findings, the inventors have conducted former investigations and discovered that, by using such a hyperbranched polymer as a binder, because hybridization is possible without decreasing the dispersibility of inorganic fine particles within a dispersion and, moreover, a high refractive index is achieved, compositions containing such a polymer and inorganic fine particles are highly suitable as film-forming compositions in the fabrication of electronic devices.

Accordingly, the invention provides:

1. A film-forming composition characterized by including a triazine ring-containing hyperbranched polymer which includes recurring unit structures of formula (1) below

[Chemical Formula 1]

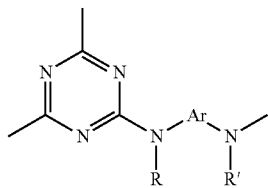

(1)

(wherein R and R' are each independently a hydrogen atom or an alkyl, alkoxy, aryl or aralkyl group; and Ar is a divalent organic group which includes either of, or both, an aromatic ring and a heterocycle), and inorganic fine particles.

2. The film-forming composition according to 1 above, wherein Ar is at least one moiety selected from the group consisting of moieties of formulas (2) to (18) below

[Chemical Formula 2]

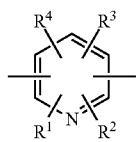

(2)

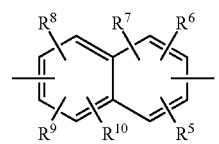

(3)

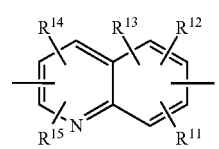

(4)

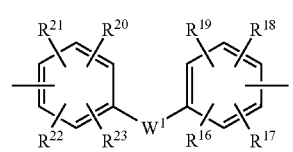

(5)

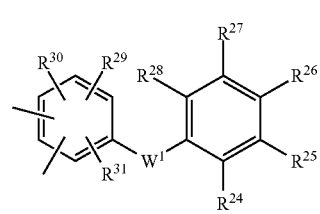

(6)

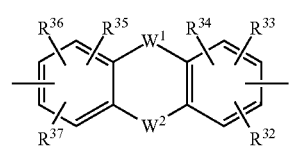

(7)

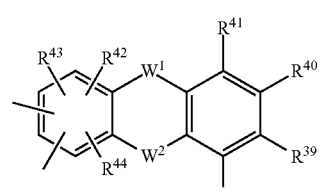

(8)

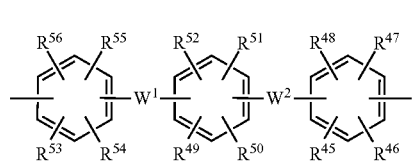

(9)

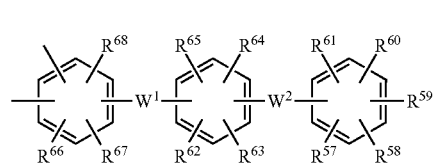

(10)

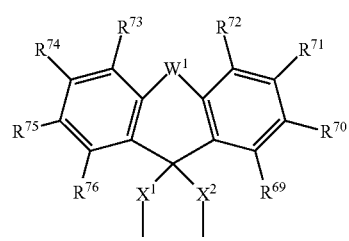

(11)

-continued

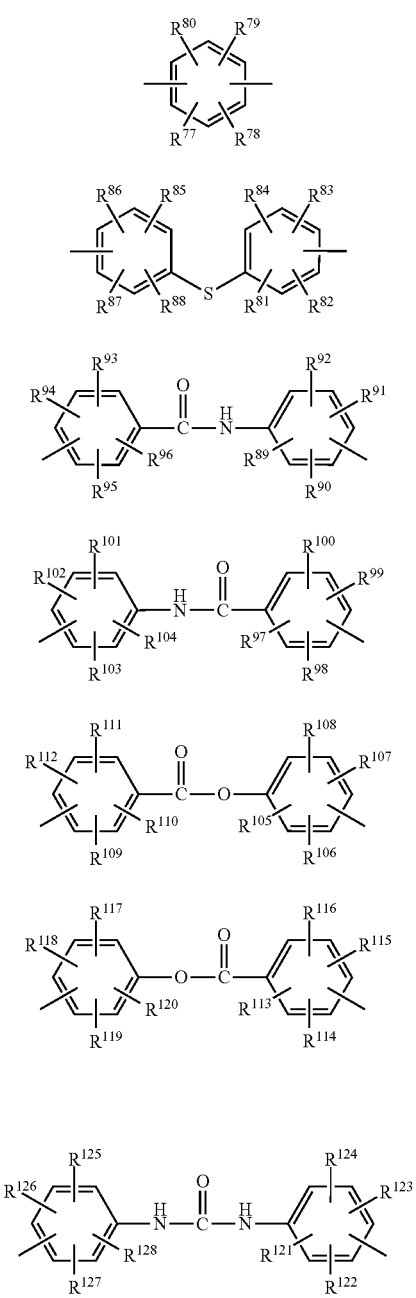

(12)

(13)

(14)

(15)

(16)

(17)

(18)

(wherein $R^1$ to $R^{128}$ are each independently a hydrogen atom, a halogen atom, a carboxyl group, a sulfonyl group, an alkyl group which may have a branched structure of 1 to 10 carbons, or an alkoxy group which may have a branched structure of 1 to 10 carbons; $W^1$ and $W^2$ are each independently a single bond, $CR^{129}R^{130}$ ($R^{129}$ and $R^{130}$ being each independently a hydrogen atom or an alkyl group which may have a branched structure of 1 to 10 carbons, with the proviso that $R^{129}$ and $R^{130}$ may together form a ring), C=O, O, S, SO, $SO_2$ or $NR^{131}$ ($R^{131}$ being a hydrogen atom or an alkyl group which may have a branched structure of 1 to 10 carbons); and $X^1$ and $X^2$ are each independently a single bond, an alkylene group which may have a branched structure of 1 to 10 carbons, or a group of formula (19) below

[Chemical Formula 3]

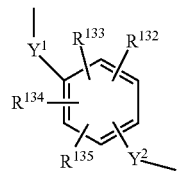

(19)

($R^{132}$ to $R^{135}$ being each independently a hydrogen atom, a halogen atom, a carboxyl group, a sulfonyl group, an alkyl group which may have a branched structure of 1 to 10 carbons, or an alkoxy group which may have a branched structure of 1 to 10 carbons; and $Y^1$ and $Y^2$ being each independently a single bond or an alkylene group which may have a branched, structure of 1 to 10 carbons)).

3. The film-forming composition according to 2 above, wherein Ar is at least one moiety selected from the group consisting of moieties of formulas (5) to (12) and moieties of formulas (14) to (18).

4. The film-forming composition according to 2 above, wherein Ar is at least one moiety selected from the group consisting of moieties of formulas (20) to (22) below.

[Chemical Formula 4]

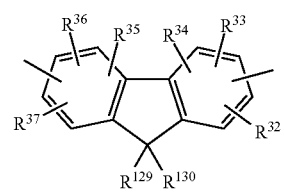

(20)

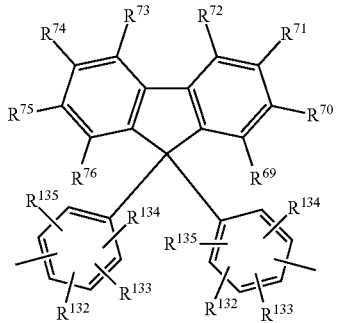

(21)

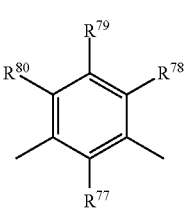

(22)

(wherein $R^{32}$ to $R^{37}$, $R^{69}$ to $R^{80}$, $R^{129}$, $R^{130}$ and $R^{132}$ to $R^{135}$ are as defined above).

5. The film-forming composition according to 1 above, wherein the recurring unit-structure has formula (23) below.

[Chemical Formula 5]

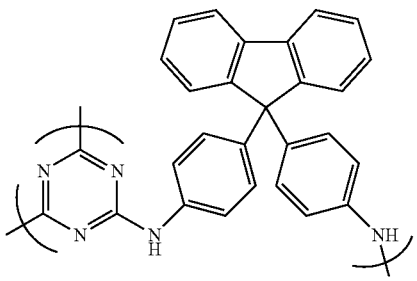

(23)

6. The film-forming composition according to 1 above, wherein the recurring unit structure has formula (24) below

[Chemical Formula 6]

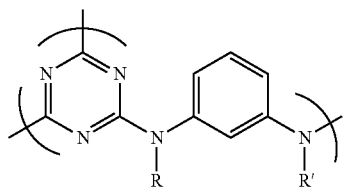

(24)

(wherein R and R' are as defined above).

7. The film-forming composition according to 6 above, wherein the recurring unit structure has formula (25) below.

[Chemcial Formula 7]

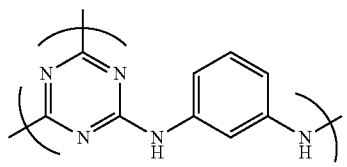

(25)

8. The film-forming composition according to any one of 1 to 7 above, wherein the hyperbranched polymer is capped on at least one end by an alkyl, aralkyl, aryl, alkylamino, alkoxysilyl-containing alkylamino, aralkylamino, arylamino, alkoxy, aralkyloxy, aryloxy or ester group.

9. The film-forming composition according to 8 above, wherein the hyperbranched polymer has at least one terminal triazine ring which is capped by an alkyl, aralkyl, aryl, alkylamino, alkoxysilyl-containing alkylamino, aralkylamino, arylamino, alkoxy, aralkyloxy, aryloxy or ester group.

10. The film-forming composition according to any one of 1 to 9 above, wherein the inorganic fine particles are an oxide, sulfide or nitride of one or more metal selected from the group consisting of Be, Al, Si, Ti, V, Fe, Cu, Zn, Y, Zr, Nb, Mo, In, Sn, Sb, Ta, W, Pb, Bi and Ce.

11. The film-forming composition according to 10 above, wherein the inorganic fine particles have a primary particle size of 2 to 50 nm and are colloidal particles of an oxide of one or more metal selected from the group consisting of Be, Al, Si, Ti, V, Fe, Cu, Zn, Y, Zr, Nb, Mo, In, Sn, Sb, Ta, W, Pb, Bi and Ce.

12. The film-forming composition according to 10 or 11 above, wherein the inorganic fine particles are surface-treated with an organosilicon compound.

13. A film obtained from the film-forming composition of any one of 1 to 12 above.

14. An electronic device having a base material and the film of 13 above formed on the base material.

15. An optical member having a base material and the film of 13 above formed on the base material.

16. A solid-state image sensor formed of a charge-coupled device or complementary metal oxide semiconductor, which sensor has at least one layer of the film of 13 above.

17. A solid-state image sensor having the film of claim 13 above as a planarization layer on a color filter.

18. A lens material, planarizing material or embedding material for a solid-state image sensor, wherein the material includes the film-forming composition of any one of 1 to 12 above.

Advantageous Effect of the Invention

This invention, by using a triazine ring-containing hyperbranched polymer having, by itself, a refractive index of at least 1.7 as a binder polymer, is able to provide a film-forming composition which can achieve a high heat resistance, high transparency, high refractive index, high solubility and low volume shrinkage.

By employing the above polymer skeleton, a high heat resistance and a high transparency can be maintained even in cases where (1) a secondary amine is used as a polymer spacer, and (2) a primary amine is substituted at the chain ends. Hence, even in cases where monomer units that were thought to invite a loss of beat resistance and transparency are used, there is a possibility that the physical properties can be controlled merely by changing the polymer skeleton to a hyperbranched structure.

The reason why the hyperbranched polymer used in this invention manifests a high refractive index is thought to be due to the fact that, because the polymer has a hyperbranched structure, the triazine rings and aryl (Ar) moieties gather together closely, raising the electron density. In particular, it is thought that when R and/or R' above are hydrogen, atoms, owing to me hyperbranched structure of the polymer, the nitrogen atoms on the triazine ring and the hydrogen atoms on the amine moieties form hydrogen bonds, causing the triazine rings and aryl (Ar) moieties to cluster together even more closely and further increasing the electron density.

Hence, even polymers which do not have sulfur atoms on the molecule exhibit high refractive indices (as measured at a wavelength of 550 nm) of 1.70 or more.

The range in this refractive index varies also with the particular application, although the lower limit value is preferably at least 1.70, more preferably at least 1.75, and even more preferably at least 1.80. The upper limit value is typically not more than about 2.00 to 1.95.

Also, even in cases where a rigid moiety such as a fluorene skeleton is used in the main recurring units of the polymer, a varnish that uses a resist solvent having a high safety can be prepared without a loss of solubility.

Furthermore, polymers which, in spite of being high-molecular-weight compounds, are of low viscosity when dissolved in a solvent and moreover contain m-phenylenediamine moieties have an excellent solubility, particularly in various types of organic solvents, and thus have an excellent handleability.

The physical properties possessed by the triazine ring-containing hyperbranched polymer used in the invention can be controlled by changing the types of monomers serving as the starting material during synthesis.

Films produced using the inventive film-forming composition which includes a triazine ring-containing hyperbranched polymer and inorganic fine particles and has characteristics such as the above can be advantageously used as components in the fabrication of electronic devices such as liquid-crystal displays, organic electroluminescent (EL) displays, optical semiconductor (LED) devices, solid-state image sensors, organic thin-film solar cells, dye-sensitized solar cells and organic thin-film transistors (TFT). Such films can also be advantageously used as lens components which are required to have a high refractive index. In particular, such films can be advantageously used as the following solid-state image sensor components which are required to have especially high refractive indices: embedding films and planarizing films on photodiodes, planarizing films before and after color filters, microlenses, planarizing films on microlenses, and conformal films.

EMBODIMENT FOR CARRYING OUT THE INVENTION

Figure 1:
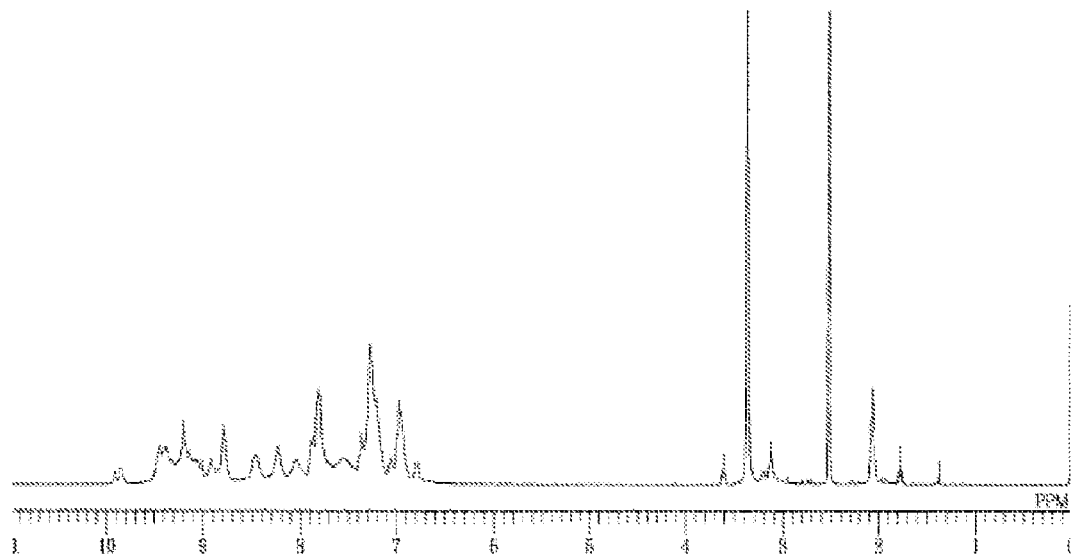
FIG. 1 is an $^1$H-NMR spectrum of the hyperbranched polymer [3] obtained in Synthesis Example 1.
Figure 2:
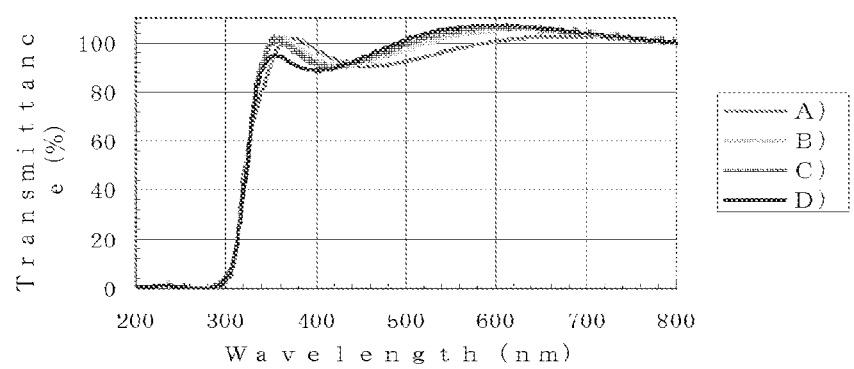
FIG. 2 is a plot showing the transmittance of the film produced in Example 1.
Figure 3:
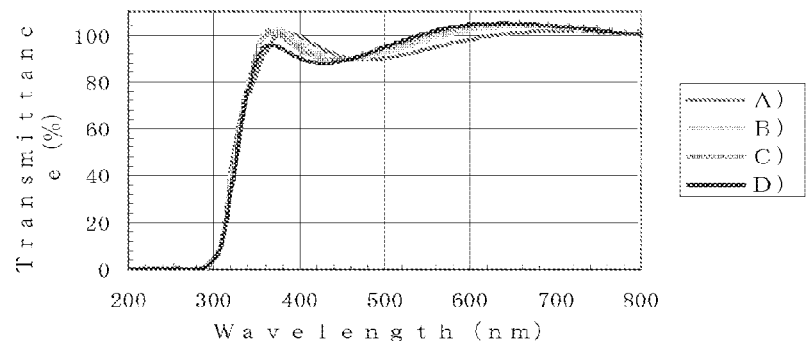
FIG. 3 is a plot showing the transmittance of the film produced in Example 2.
Figure 4:
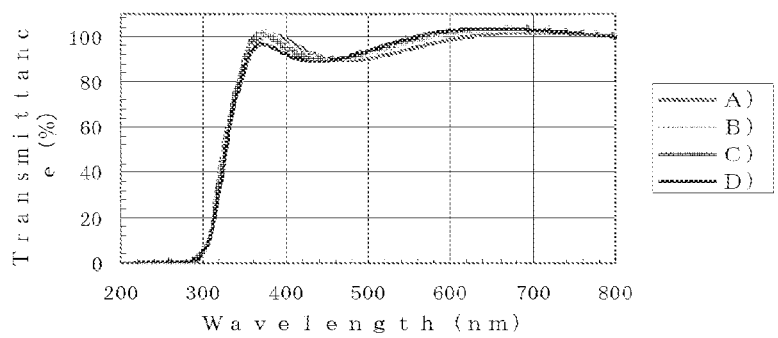
FIG. 4 is a plot showing the transmittance of the film produced in Example 3.
Figure 5:
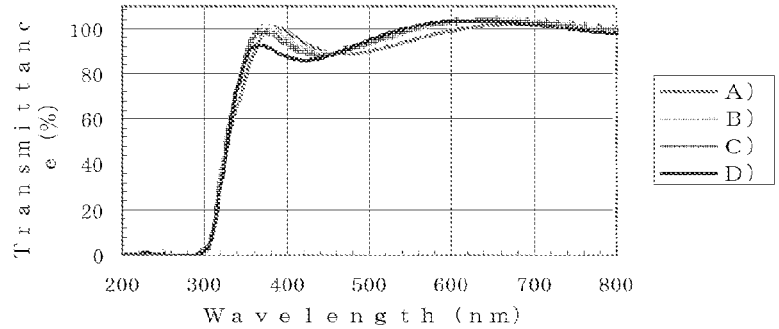
FIG. 5 is a plot showing the transmittance of the film produced in Example 4.
Figure 6:
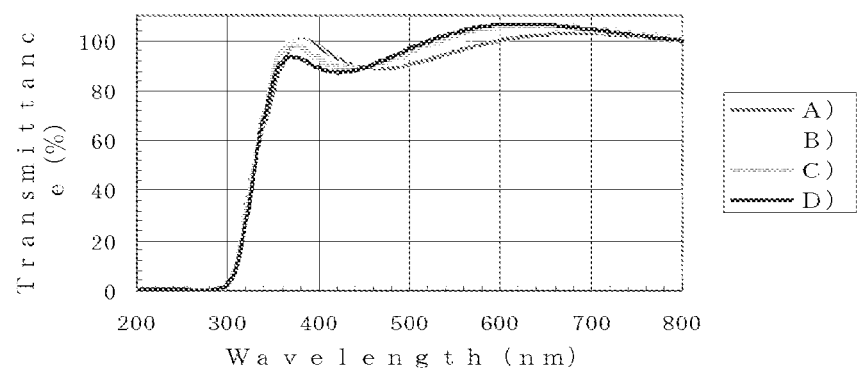
FIG. 6 is a plot showing the transmittance of the film produced in Example 5.
Figure 7:
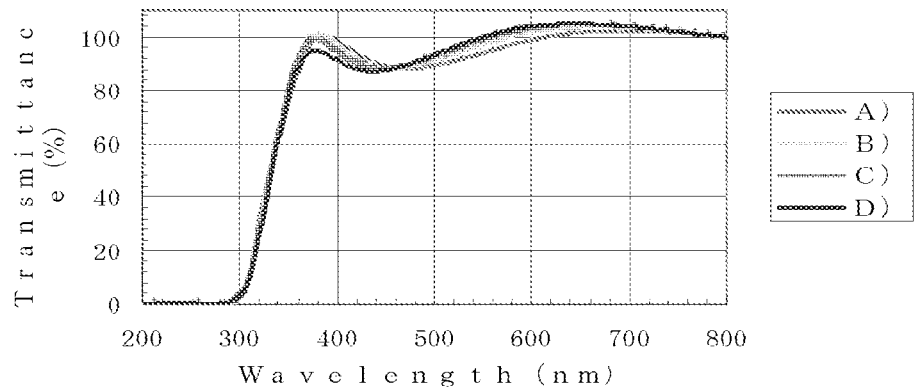
FIG. 7 is a plot showing the transmittance of the film produced in Example 6.
Figure 8:
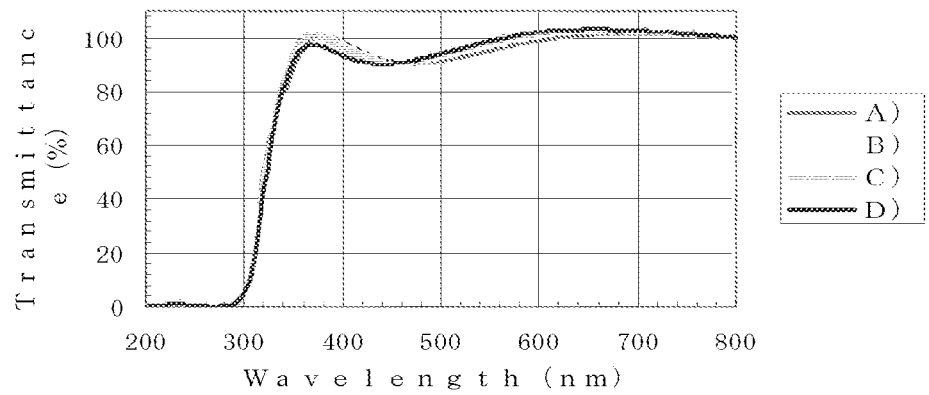
FIG. 8 is a plot showing the transmittance of the film produced in Example 7.
Figure 9:
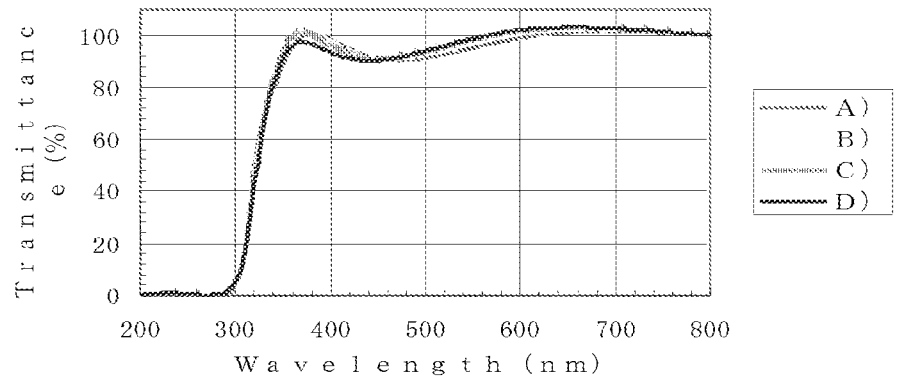
FIG. 9 is a plot showing the transmittance of the film produced in Example 8.
Figure 10:
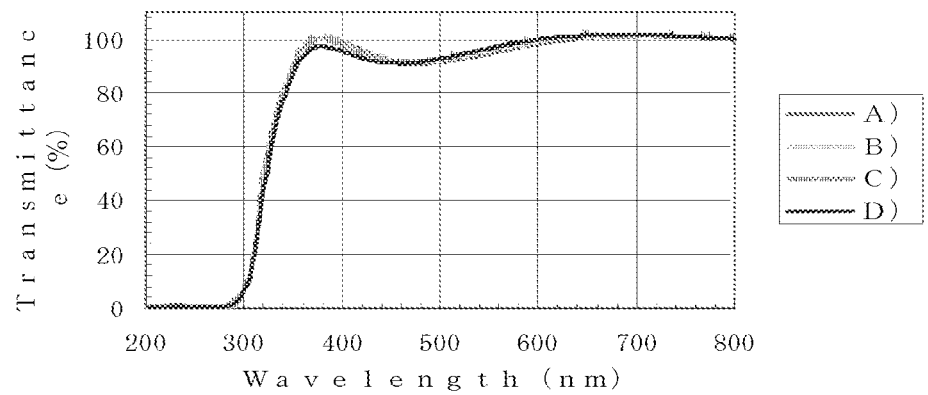
FIG. 10 is a plot showing the transmittance of the film produced in Example 9.
Figure 11:
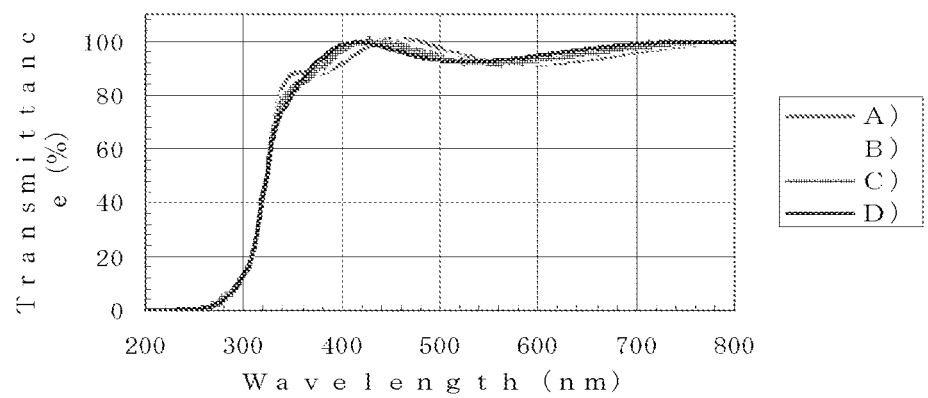
FIG. 11 is a plot showing the transmittance of the film produced in Comparative Example 1.
Figure 12:
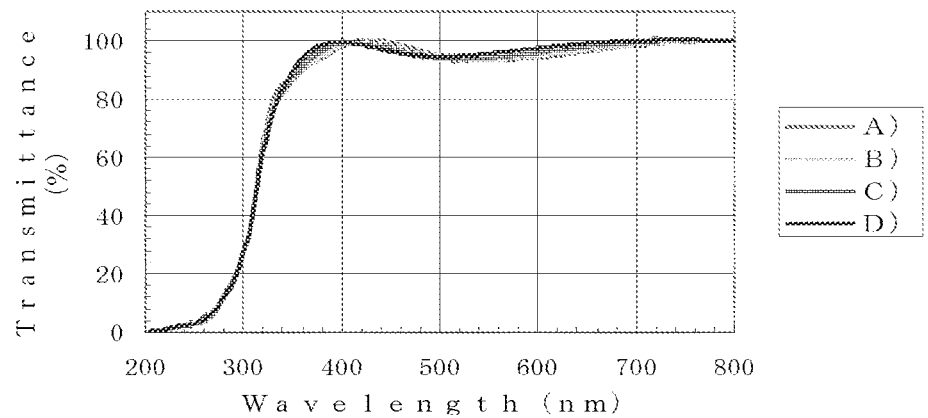
FIG. 12 is a plot showing the transmittance of the film produced in Comparative Example 2.
Figure 13:
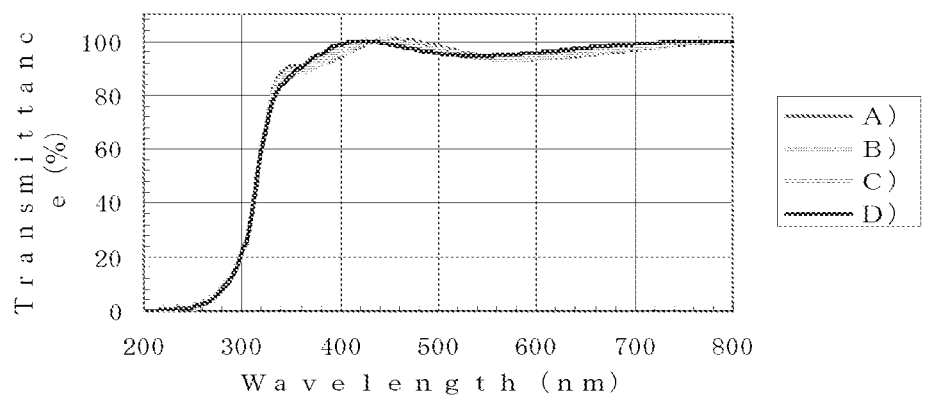
FIG. 13 is a plot showing the transmittance of the film produced in Comparative Example 3.

The invention is described more fully below.

The film-forming composition according to the present invention includes a hyperbranched polymer containing recurring unit structures of formula (1) below and inorganic fine particles.

[Chemical Formula 8]

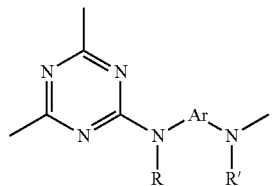

(1)

In the above formula, R and R' are each independently a hydrogen atom or an alkyl, alkoxy, aryl or aralkyl group.

In the invention, the number of carbons on the alkyl group, although not particularly limited, is preferably from 1 to 20. From the standpoint of further increasing the heat resistance of the polymer, the number of carbons is more preferably from 1 to 10, and even more preferably from 1 to 3. The alkyl group may have a linear, branched or cyclic structure.

Illustrative examples of alkyl groups include methyl, ethyl, n-propyl, isopropyl, cyclopropyl, n-butyl, isobutyl, s-butyl, t-butyl, cyclobutyl, 1-methylcyclopropyl, 2-methylcyclopropyl, n-pentyl, 1-methyl-n-butyl, 2-methyl-n-butyl, 3-methyl-n-butyl, 1,1-dimethyl-n-propyl, 1,2-dimethyl-n-propyl, 2,2-dimethyl-n-propyl, 1-ethyl-n-propyl, cyclopentyl, 1-methylcyclobutyl, 2-methylcyclobutyl, 3-methylcyclobutyl, 1,2-dimethylcyclopropyl, 2,3-dimethylcyclopropyl, 1-ethylcyclopropyl, 2-ethylcyclopropyl, n-hexyl, 1-methyl-n-pentyl, 2-methyl-n-pentyl, 3-methyl-n-pentyl, 4-methyl-n-pentyl, 1,1-dimethyl-n-butyl, 1,2-dimethyl-n-butyl, 1,3-dimethyl-n-butyl, 2,2-dimethyl-n-butyl, 2,3-dimethyl-n-butyl, 3,3-dimethyl-n-butyl, 1-ethyl-n-butyl, 2-ethyl-n-butyl, 1,1,2-trimethyl-n-propyl, 1,2,2-trimethyl-n-propyl, 1-ethyl-1-methyl-n-propyl, 1-ethyl-2-methyl-n-propyl, cyclohexyl, 1-methylcyclopentyl, 2-methylcyclopentyl, 3-methylcyclopentyl, 1-ethylcyclobutyl, 2-ethylcyclobutyl, 3-ethylcyclobutyl, 1,2-dimethylcyclobutyl, 1,3-dimethylcyclobutyl, 2,2-dimethylcyclobutyl, 2,3-dimethylcyclobutyl, 2,4-dimethylcyclobutyl, 3,3-dimethylcyclobutyl, 1-n-propylcyclopropyl, 2-n-propylcyclopropyl, 1-isopropylcyclopropyl, 2-isopropylcyclopropyl, 1,2,2-trimethylcyclopropyl, 1,2,3-trimethylcyclopropyl, 2,2,3-trimethylcyclopropyl, 1-ethyl-2-methylcyclopropyl, 2-ethyl-1-methylcyclopropyl, 2-ethyl-2-methylcyclopropyl and 2-ethyl-3-methylcyclopropyl.

The number of carbons on the alkoxy group, although not particularly limited, is preferably from 1 to 20. From the standpoint of further increasing the heat resistance of the polymer, the number of carbons is more preferably from 1 to 10, and even more preferably from 1 to 3. The alkyl moiety thereon may have a linear, branched or cyclic structure.

Illustrative examples of alkoxy groups include methoxy, ethoxy, n-propoxy, isopropoxy, n-butoxy, isobutoxy, s-butoxy, t-butoxy, n-pentoxy, 1-methyl-n-butoxy, 2-methyl-n-butoxy, 3-methyl-n-butoxy, 1,1-dimethyl-n-propoxy, 1,2-dimethyl-n-propoxy, 2,2-dimethyl-n-propoxy, 1-ethyl-n-propoxy, n-hexyloxy, 1-methyl-n-pentyloxy, 2-methyl-n-pentyloxy, 3-methyl-n-pentyloxy, 4-methyl-n-pentyloxy, 1,1-dimethyl-n-butoxy, 1,2-dimethyl-n-butoxy, 1,3-dimethyl-n-butoxy, 2,2-dimethyl-n-butoxy, 2,3-dimethyl-n-butoxy, 3,3-dimethyl-n-butoxy, 1-ethyl-n-butoxy, 2-ethyl-n-butoxy, 1,1,2-trimethyl-n-propoxy, 1,2,2-trimethyl-n-propoxy, 1-ethyl-1-methyl-n-propoxy and 1-ethyl-2-methyl-n-propoxy.

The number of carbons on the aryl group, although not particularly limited, is preferably from 6 to 40. From the standpoint of further increasing the heat resistance of the polymer, the number of carbons is more preferably from 6 to 16, and even more preferably from 6 to 13.

Illustrative examples of aryl groups include phenyl, o-chlorophenyl, m-chlorophenyl, p-chlorophenyl, o-fluorophenyl, p-fluorophenyl, o-methoxyphenyl, p-methoxyphenyl, p-nitrophenyl, p-cyanophenyl, α-naphthyl, β-naphthyl, o-biphenylyl, m-biphenylyl, p-biphenylyl, 1-anthryl, 2-anthryl, 9-anthryl, 1-phenanthryl, 2-phenanthryl, 3-phenanthryl, 4-phenanthryl and 9-phenanthryl.

The number of carbons on the aralkyl group, although not particularly limited, is preferably from 7 to 20. The alkyl moiety thereon may be linear, branched or cyclic.

Illustrative examples of aralkyl groups include benzyl, p-methylphenylmethyl, m-methylphenylmethyl, o-ethylphenylmethyl, m-ethylphenylmethyl, p-ethylphenylmethyl, 2-propylphenylmethyl, 4-isopropylphenylmethyl, 4-isobutylphenylmethyl and α-naphtylmethyl.

In above formula (1), Ar is a divalent organic group which includes either of, or both, an aromatic ring and a heterocycle, and is not otherwise limited. In the present invention, Ar is preferably at least one moiety from among those of formulas (2) to (18) below, more preferably at least one moiety from among those of formulas (5) to (18), and even more preferably at least one moiety from among those of formulas (5), (7), (8), (11), (12) and (14) to (18).

[Chemical Formula 9]

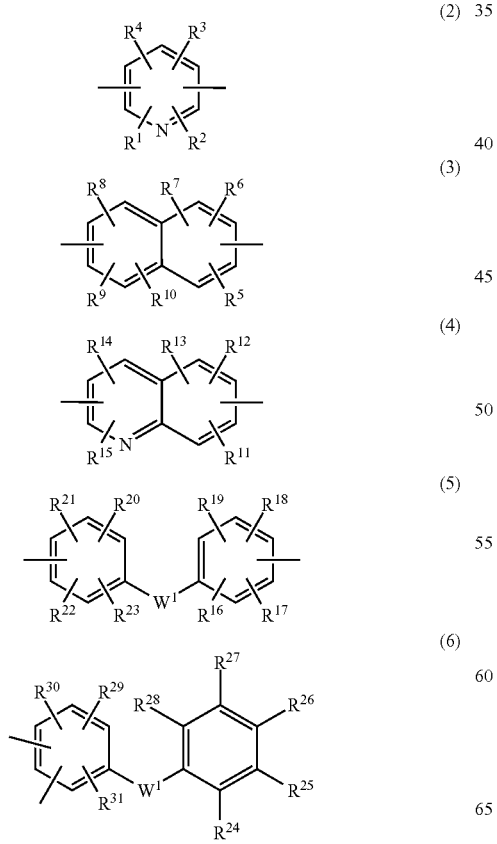

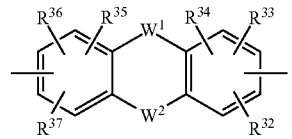

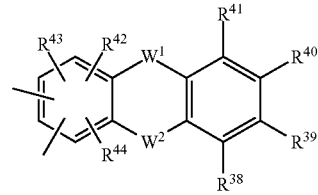

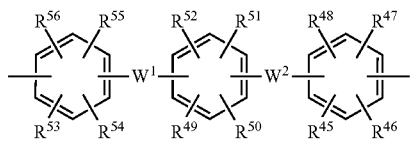

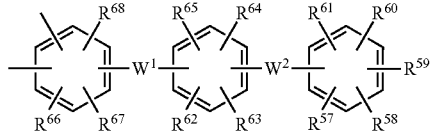

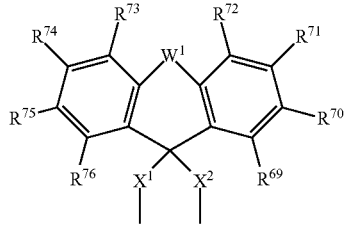

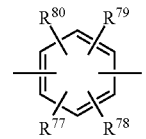

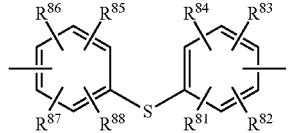

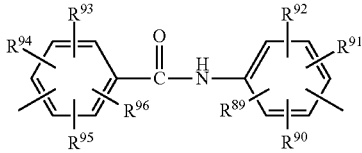

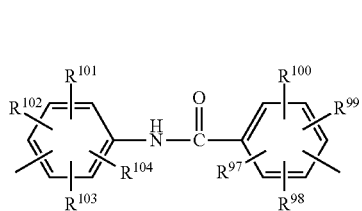

-continued

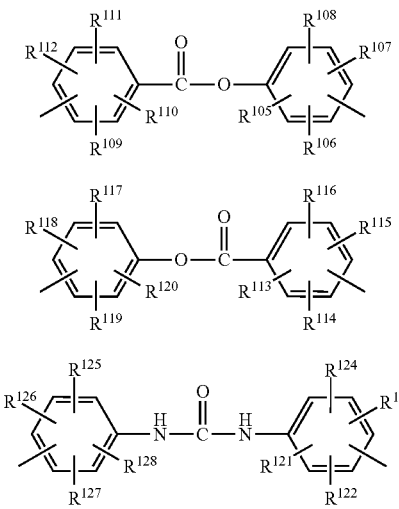

In the above formulas, $R^1$ to $R^{128}$ are each independently a hydrogen atom, a halogen atom, a carboxyl group, a sulfonyl group, an alkyl group which may have a branched structure of 1 to 10 carbons, or an alkoxy group which may have a branched structure of 1 to 10 carbons. $W^1$ and $W^2$ are each independently a single bond, $CR^{129}R^{130}$ (wherein $R^{129}$ and $R^{130}$ are each independently a hydrogen atom or an alkyl group which may have a branched structure of 1 to 10 carbons, with the proviso that $R^{129}$ and $R^{130}$ may together form a ring), C=O, O, S, SO, $SO_2$ or $NR^{131}$ (wherein $R^{131}$ is a hydrogen atom or an alkyl group which may have a branched structure of 1 to 10 carbons).

These alkyl groups and alkoxy groups are exemplified by the same groups as mentioned above.

Examples of the halogen atom include fluorine, chlorine, bromine and iodine.

$X^1$ and $X^2$ are each independently a single bond, an alkylene group which may have a branched structure of 1 to 10 carbons, or a group of formula (19) below.

[Chemical Formula 10]

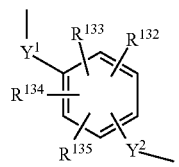

In the above formula, $R^{132}$ to $R^{135}$ are each independently a hydrogen atom, a halogen atom, a carboxyl group, a sulfonyl group, an alkyl group which may have a branched structure of 1 to 10 carbons, or an alkoxy structure which may have a branched structure of 1 to 10 carbons. $Y^1$ and $Y^2$ are each independently a single bond or an alkylene group which may have a branched structure of 1 to 10 carbons.

These halogen atoms, alkyl groups and alkoxy groups are exemplified by the same groups as mentioned above.

Illustrative examples of the alkylene group which may have a branched structure of 1 To 10 carbons include methylene, ethylene, propylene, trimethylene, tetramethylene and pentamethylene.

Preferred examples of Ar in the present invention include divalent organic groups having a fluorene ring. For example, divalent organic groups of formulas (20) and (21) below are preferred.

[Chemical Formula 11]

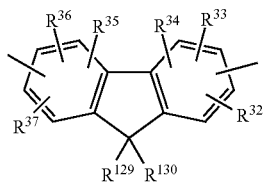

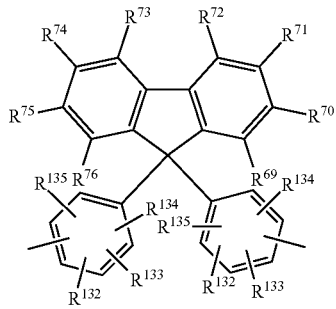

In the above formulas, $R^{32}$ to $R^{37}$, $R^{69}$ to $R^{76}$, $R^{129}$, $R^{130}$ and $R^{132}$ to $R^{135}$ are each as defined above, although all are preferably hydrogen atoms.

Illustrative examples of the aryl groups of above formulas (2) to (18) include, but are not limited to, the following.

[Chemical Formula 12]

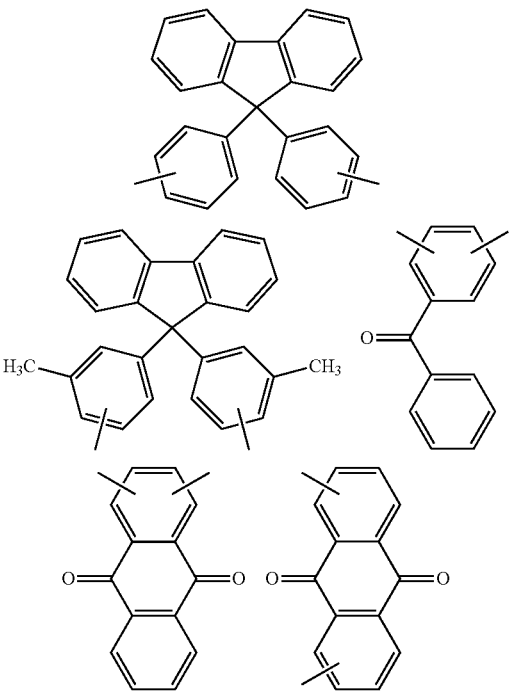

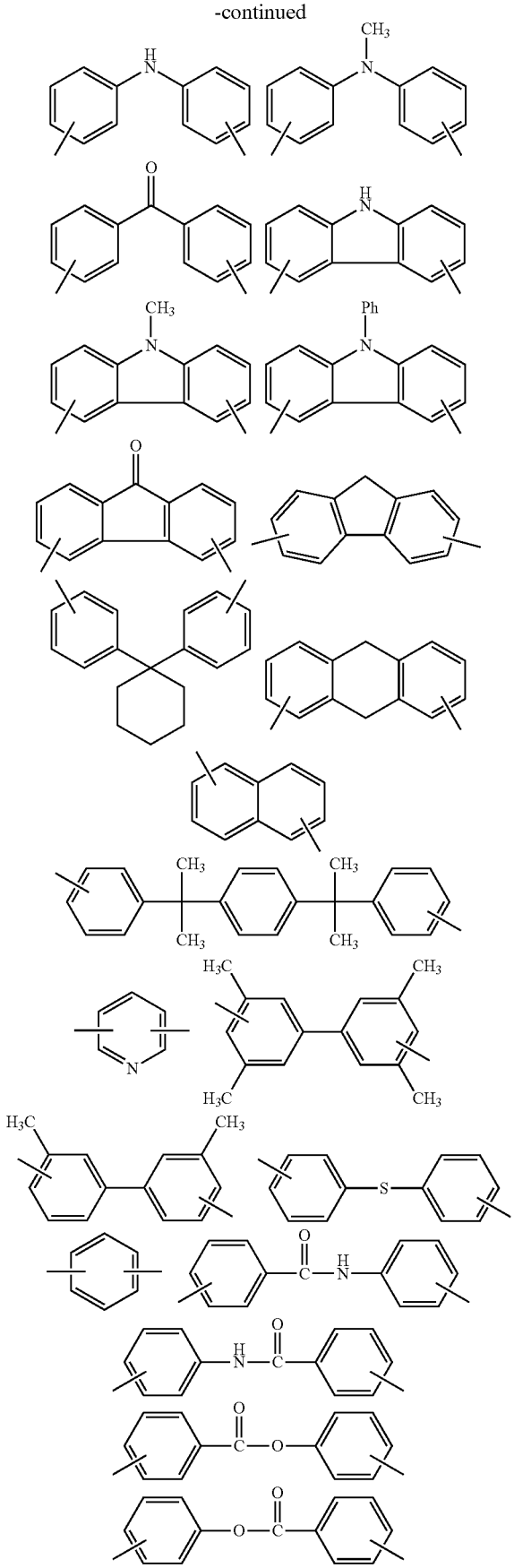
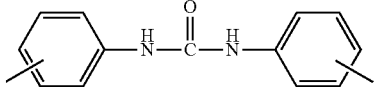
Of these, to obtain a polymer having a higher refractive index, the aryl groups of the following formulas are more preferred.
[Chemical Formula 13]
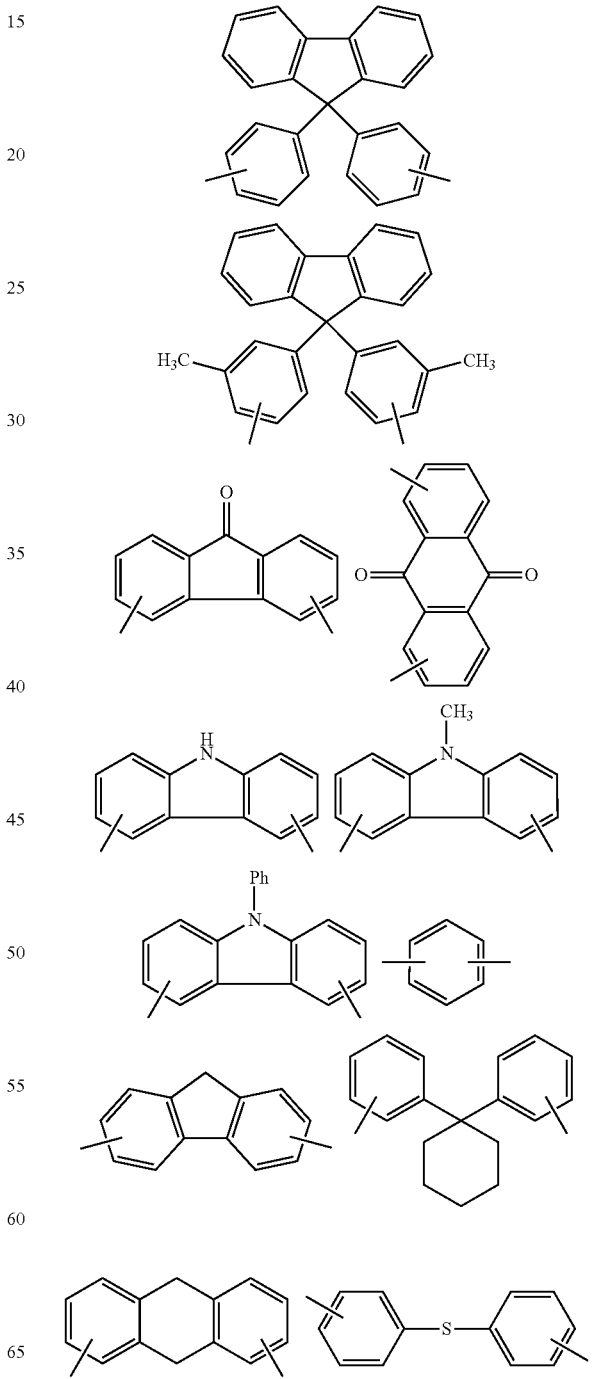

-continued

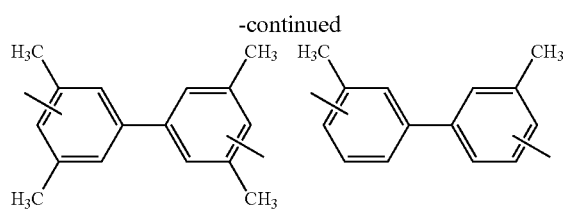
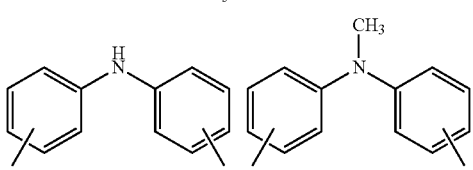
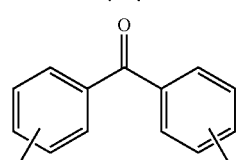
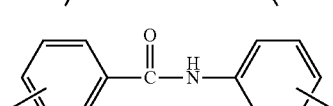
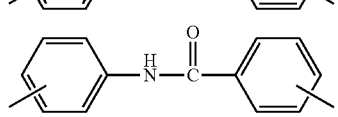
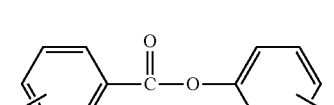
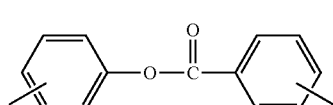
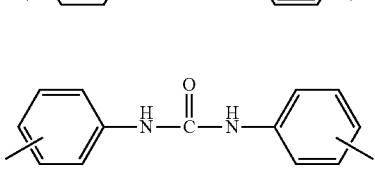

Moreover, from the standpoint of achieving a high refractive index, an aryl (Ar) moiety with a rigid structure having a cyclic skeleton such as a fluorene skeleton or a carbazole skeleton is preferable because the aryl (Ar) moieties tend to cluster together, increasing the electron density. Alternatively, a simple benzene ring is also preferable because, being small structures, aryl (Ar) moieties tend to cluster together, increasing the electron density.

As for benzene ring linkages such as $W^1$, functional groups having a high hydrogen bonding ability, such as carbonyl containing groups and amines are preferred because these form hydrogen bonds with hydrogen atoms on amine moieties (in cases where R and/or R' are hydrogen atoms), as a result of which the aryl (Ar) moieties tend to cluster together, increasing the electron density.

From the above standpoint, aryl groups of the following formulas are preferred.

[Chemical Formula 14]

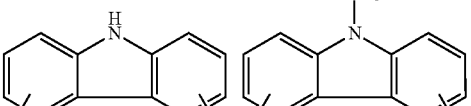
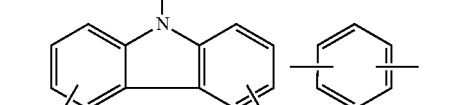
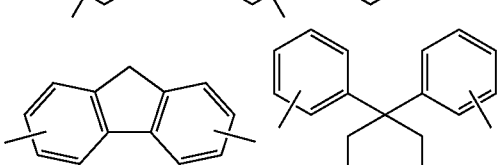
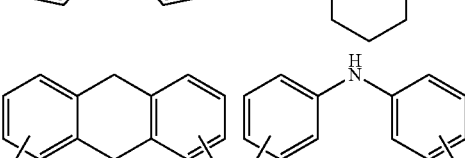
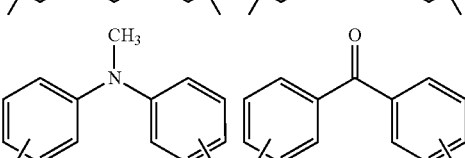
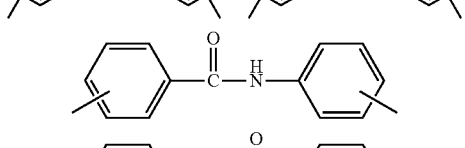
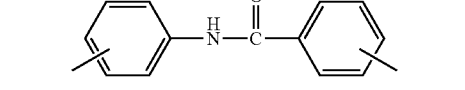

-continued

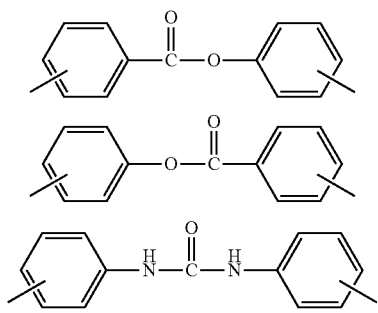

To achieve an even higher refractive index, aryl groups of the following formulas are more preferred.

[Chemical Formula 15]

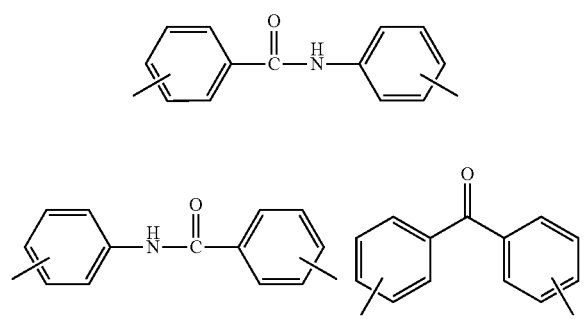

Examples of preferred recurring unit structures include, but are not limited to, those of formula (23) below.

[Chemical Formula 16]

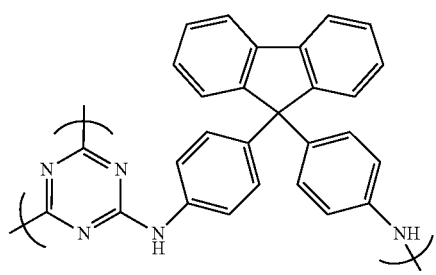

(23)

to further increase the solubility of the hyperbranched polymer in highly safe solvents such as resist solvents, an m-phenylenediamine derivative group of formula (22) below is preferred as the Ar group.

[Chemical Formula 17]

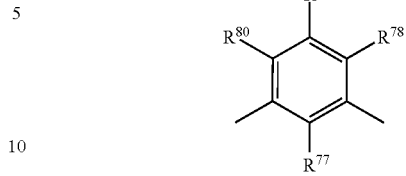

(22)

In the above formula, $R^{77}$ to $R^{80}$ are as defined above, although all are preferably hydrogen atoms.

Therefore, preferred recurring unit structures which give the polymer a good solubility include those of formula (24) below. In particular, hyperbranched polymers having recurring unit structures of formula (25) below in which R and R' are both hydrogen atoms are best.

[Chemical Formula 18]

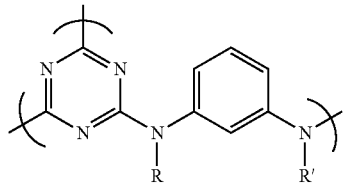

(24)

In the above formula, R and R' are as defined above.

[Chemical Formula 19]

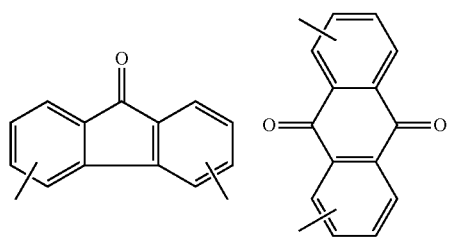

(25)

The hyperbranched polymer used in the present invention has a weight-average molecular weight which, although not particularly limited, is preferably between 500 and 500,000, and more preferably between 500 and 100,000. To further enhance the heat resistance and lower the shrinkage ratio, the weight-average molecular weight is preferably at least 2,000. To further increase the solubility and lower the viscosity of the resulting solution, the weight-average molecular weight is preferably 50,000 or less, more preferably 30,000 or less, and even more preferably 10,000 or less.

The weight-average molecular weight in the invention is the weight-average molecular weight measured by gel permeation chromatography (GPC) against a polystyrene standard.

Exemplary methods for preparing the triazine ring-containing hyperbranched polymer used in the invention are described. The preparation methods are divided up below into Schemes 1, 2 and 3, each of which is further divided into "a", "b," etc.

For example, as shown in Scheme 1-a below, a hyperbranched polymer having the recurring structure (23') can be obtained by reacting a cyanuric halide (26) with an amino group-bearing bisaminophenylfluorene compound (27) in a suitable organic solvent.

As shown in Scheme 1-b below, a hyperbranched polymer having the recurring structure (24') can be obtained by reacting a cyanuric halide (26) with an m-phenylenediamine compound (28) in a suitable organic solvent.

[Chemical Formula 20]

Scheme 1-a

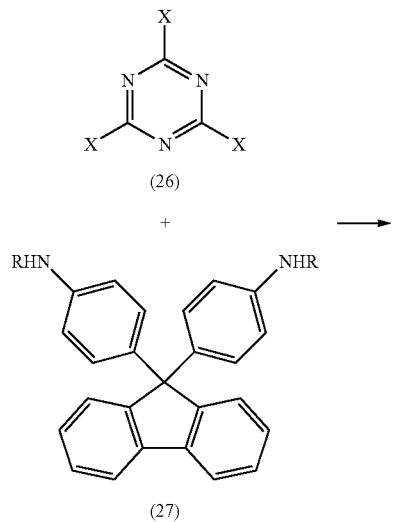

(26)

+

(27)

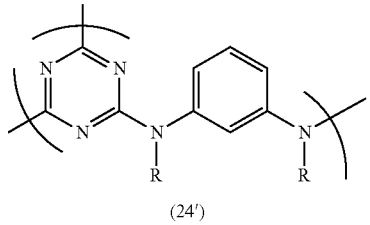

(24')

In the above formulas, each occurrence of X is independently a halogen atom; and R is as defined above.

Alternatively, as shown in Scheme 2-a below, a hyperbranched polymer having the recurring structure (23') can be synthesized from a compound (29) obtained by reacting equimolar amounts of a cyanuric halide (26) and an amino group-bearing bisaminophenylfluorene compound (27) in a suitable organic solvent.

As shown in Scheme 2-b below, a hyperbranched polymer having the recurring structure (24') can be synthesized from a compound (30) obtained by reacting equimolar amounts of a cyanuric halide (26) and an m-phenylenediamine compound (28) in a suitable organic solvent.

[Chemical Formula 21]

Scheme 2-a

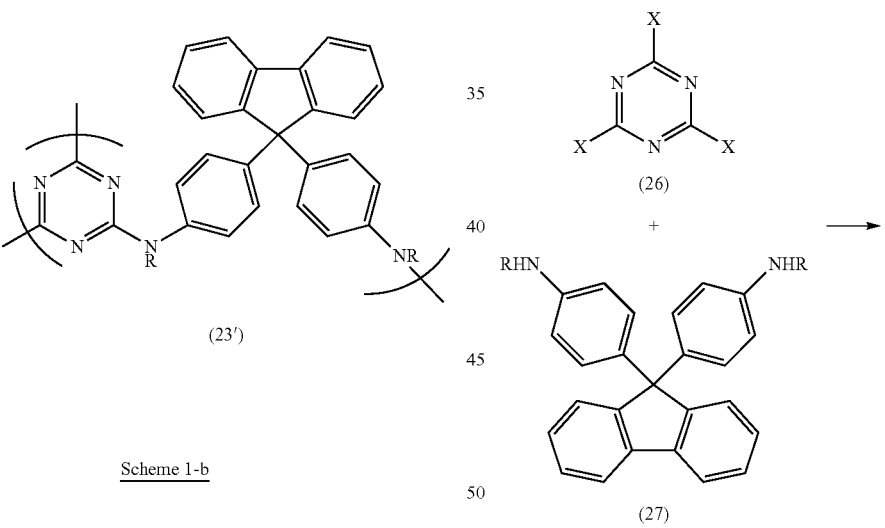

(23')

Scheme 1-b

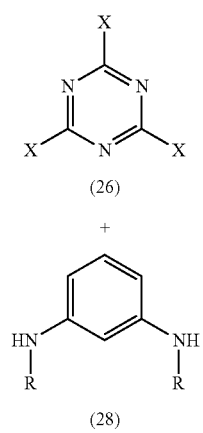

(26)

+

(28)

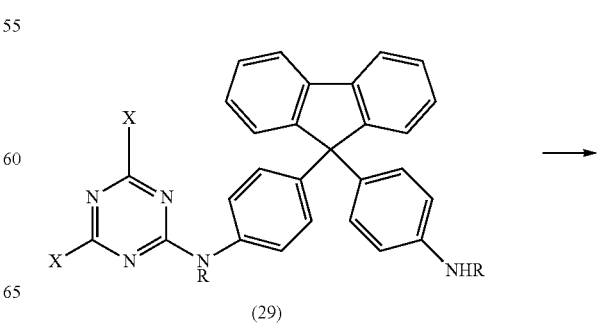

(29)

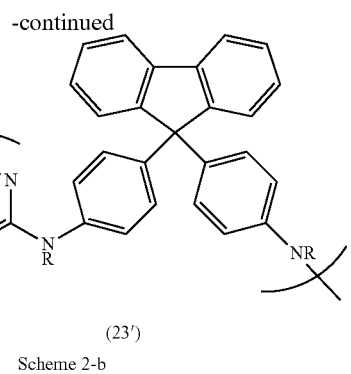

(23')

Scheme 2-b

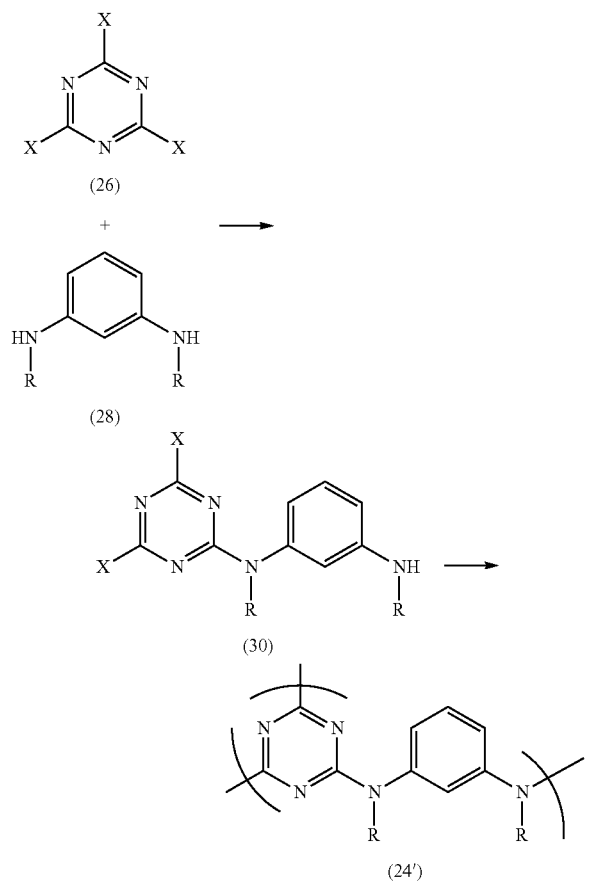

In the above formulas, each occurrence of X is independently a halogen atom; and R is as defined above.

By using the above methods, the hyperbranched polymer of the invention can be easily and safely produced at a low cost. Because the reaction time in these methods is much shorter than in the synthesis of ordinary polymers, these production methods are compatible with recent concerns for the environment and are capable of reducing $CO_2$ emissions. Moreover, such methods can carry out stable production even when the scale of production is greatly expanded, and thus allow a stable supply system to be maintained even at an industrial level.

In particular, taking into account the stability of cyanuric chloride as a starting material and also from an industrial perspective, the production methods of Scheme 2 are more preferred.

In the methods of Schemes 1 and 2, the respective starting materials may be charged in any suitable amounts so long as the target hyperbranched polymer is obtained, although the use of from 0.01 to 10 equivalents of the diamines compound (27), (28) per equivalent of the cyanuric halide (26) is preferred.

In the method of Scheme 1 in particular, it is preferable to avoid using 3 equivalents of the diamino compound (27), (28) per 2 equivalents of the cyanuric halide (26). By having the number of equivalents of the respective functional groups differ from this ratio, the formation of a gel can be prevented.

To obtain hyperbranched polymers of various molecular weights which have many terminal triazine rings, it is preferable to use the diamino compound (27), (28) in an amount of less than 3 equivalents per 2 equivalents of the cyanuric halide (26).

On the other hand, to obtain hyperbranched polymers of various molecular weights which have many terminal amines, it is preferable to use the cyanuric halide (26) in an amount of less than 2 equivalents per 3 equivalents of the diamino compound (27), (28).

For example, in cases where a thin film has been produced, in order for the film to have an excellent transparency and light resistance, a hyperbranched polymer having many terminal triazine rings is preferred.

By suitably regulating the amounts of the diamino compound (27), (28) and the cyanuric halide (26) in this way, the molecular weight of the resulting hyperbranched polymer can easily be regulated.

Various solvents that are commonly used in this type of reaction may be used as the organic solvent. Illustrative examples include tetrahydrofuran, dioxane, dimethylsulfoxide; amide solvents such as N,N-dimethylformamide, N-methyl-2-pyrrolidone, tetramethylurea, hexamethylphosphoramide, N,N-dimethylacetamide, N-methyl-2-piperidone, N,N-dimethylethyleneurea, N,N,N',N'-tetramethylmalonamide, N-methylcaprolactam, N-acetylpyrrolidine, N,N-diethylacetamide, N-ethyl-2-pyrrolidone, N,N-dimethylpropionamide, N,N-dimethylisobutyramide, N-methylformamide and N,N'-dimethylpropyleneurea; and mixed solvents thereof.

Of the above, N,N-dimethylformamide, dimethylsulfoxide, N-methyl-2-pyrrolidone, N,N-dimethylacetamide and mixed solvents thereof are preferred. N,N-Dimethylacetamide and N-methyl-2-pyrrolidone are especially preferred.

In the Scheme 1 reaction and the second stage reaction in Scheme 2, the reaction temperature may be suitably set in the range from the melting point of the solvent used to the boiling point of the solvent, although the temperature is preferably from about 0° C. to about 150° C., and more preferably from 60 to 100° C.

In the Scheme 1 reaction in particular, to suppress linearity and increase the degree of branching, the reaction temperature is preferably from 60 to 150° C., more preferably from 80 to 150° C., and even more preferably from 80 to 120° C.

In the first stage reaction of Scheme 2, the reaction temperature may be suitably set in the range from the melting point of the solvent used to the boiling point of the solvent, with a temperature of from about −50 to about 50° C. being preferred, a temperature of from about −20 to about 50° C. being more preferred, a temperature of from about −10 to about 50° C. being even more preferred, and a temperature of from −10 to 10° C. being still more preferred.

In the Scheme 2 method in particular, the use of a two-stage process with a first step involving reaction at from −50 to 50° C., followed by a second step involving reaction at from 60 to 150° C. is preferred.

In each of the above reactions, the ingredients may be added in any order. However, in the Scheme 1 reaction, the best method is to heat a solution containing either the cyanuric halide (26) or the diamine compound (27), (28) and the organic solvent to a temperature of from 60 to 150° C., and preferably from 80 to 150° C., then add the remaining ingredient—the diamine compound (27), (28) or the cyanuric halide (26)—to the resulting solution, at this temperature.

In this case, either ingredient may be used as the ingredient which is initially dissolved in the solvent or as the ingredient which is subsequently added, although a method wherein the cyanuric halide (26) is added to a heated solution of the diamine compound (27), (28) is preferred.

In the Scheme 2 reactions, either ingredient may be used as the ingredient which is initially dissolved in the solvent or as the ingredient which is subsequently added, although a method wherein the diamine compound (27), (28) is added to a cooled solution of the cyanuric halide (26) is preferred.

The subsequently added ingredient may be added neat or may be added as a solution of the ingredient dissolved in an organic solvent such as any of those mentioned above. However, taking into account the ease of the operations and the controllability of the reaction, the latter approach is preferred.

Also, addition may be carried out gradually such as in a dropwise manner, or the entire amount may be added all at once in a batchwise manner.

In Scheme 1, even in cases where the reaction is carried out in a single stage (without raising the temperature in a stepwise fashion), in a heated state and after both, compounds have been mixed, the desired triazine ring-containing hyperbranched polymer can be obtained without gelation.

In the Scheme 1 reaction and the second stage reaction in Scheme 2, various bases which are commonly used during or after polymerization may be added.

Illustrative examples of such bases include potassium carbonate, potassium hydroxide, sodium carbonate, sodium hydroxide, sodium bicarbonate, sodium ethoxide, sodium acetate, lithium carbonate, lithium hydroxide, lithium oxide, potassium acetate, magnesium oxide, calcium oxide, barium hydroxide, trilithium phosphate, trisodium phosphate, tripotassium phosphate, cesium fluoride, aluminum oxide, ammonia, trimethylamine, triethylamine, diisopropylmethylamine, diisopropylethylamine, N-methylpiperidine, 2,2,6,6-tetramethyl-N-methylpiperidine, pyridine, 4-dimethylaminopyridine and N-methylmorpholine.

The amount of base added per equivalent of the cyanuric halide (26) is preferably from 1 to 100 equivalents, and more preferably from 1 to 10 equivalents. These bases may also be used in the form of an aqueous solution.

Although it is preferable for no starting ingredients to remain in the resulting polymer, some starting material may remain, provided this does not interfere with the advantageous effects of the invention.

In the methods of both schemes, following reaction completion, the product can be easily purified by a suitable technique such as reprecipitation.

Also, in the present invention, some portion of the halogen atoms on at least one terminal triazine ring may be capped by, for example, an alkyl aralkyl, aryl, alkylamino, alkoxysilyl-containing alkylamino, aralkylamino, arylamino, alkoxy, aralkyloxy, aryloxy or ester group.

Of these, alkylamino, alkoxysilyl-containing alkylamino, aralkylamino and arylamino groups are preferred. Alkylamino and arylamino groups are more preferred. An arylamino group is even more preferred.

Illustrative examples of ester groups include methoxycarbonyl and ethoxycarbonyl.

Illustrative examples of alkylamino groups include methylamino, ethylamino, n-propylamino, isopropylamino, n-butylamino, isobutylamino, s-butylamino, t-butylamino, n-pentylamino, 1-methyl-n-butylamino, 2-methyl-n-butylamino, 3-methyl-n-butylamino, 1,1-dimethyl-n-propylamino, 1,2-dimethyl-n-propylamino, 2,2-dimethyl-n-propylamino, 1-ethyl-n-propylamino, n-hexylamino, 1-methyl-n-pentylamino, 2-methyl-n-pentylamino, 3-methyl-n-pentylamino, 4-methyl-n-pentylamino, 1,1-dimethyl-n-butylamino, 1,2-dimethyl-n-butylamino, 1,3-dimethyl-n-butylamino, 2,2-dimethyl-n-butylamino, 2,3-dimethyl-n-butylamino, 3,3-dimethyl-n-butylamino, 1-ethyl-n-butylamino, 2-ethyl-n-butylamino, 1,1,2-trimethyl-n-propylamino, 1,2,2-trimethyl-n-propylamino, 1-ethyl-1-methyl-n-propylamino and 1-ethyl-2-methyl-n-propylamino.

Illustrative examples of aralkylamino groups include benzylamino, methoxycarbonylphenylmethylamino, ethoxycarbonylphenylmethylamino, p-methylphenylmethylamino, m-methylphenylmethylamino, o-ethylphenylmethylamino, m-ethylphenylmethylamino, p-ethylphenylmethylamino, 2-propylphenylmethylamino, 4-isopropylphenylmethylamino, 4-isobutylphenylmethylamino, naphthylmethylamino, methoxycarbonylnaphthylmethylamino and ethoxycarbonylnaphthylmethylamino.

Illustrative examples of arylamino groups include phenylamino, methoxycarbonylphenylamino, ethoxycarbonylphenylamino, naphthylamino, methoxycarbonylnaphthylamino, ethoxycarbonynaphthylamino, anthranylamino, pyrenylamino, biphenylamino, terphenylamino and fluorenylamino.

Alkoxysilyl-containing alkylamino groups are exemplified by monoalkoxysilyl-containing alkylamino groups, dialkoxysilyl-containing alkylamino groups and trialkoxysilyl-containing alkylamino groups. Illustrative examples include 3-trimethoxysilylpropylamino, 3-triethoxysilylpropylamino, 3-dimethylethoxysilylpropylamino, 3-methyldiethoxysilylpropylamino, N-(2-aminoethyl)-3-dimethylmethoxysilylpropylamino, N-(2-aminoethyl)-3-methyldimethoxysilylpropylamino and N-(2-aminoethyl)-3-trimethoxysilylpropylamino.

Illustrative examples of aryloxy groups include phenoxy, naphthoxy, anthranyloxy, pyrenyloxy, biphenyloxy, terphenyloxy and fluorenyloxy.

Illustrative examples of aralkyloxy groups include benzyloxy, p-methylphenylmethyloxy, m-methylphenylmethyloxy, o-ethylphenylmethyloxy, m-ethylphenylmethyloxy, p-ethylphenylmethyloxy, 2-propylphenylmethyloxy, 4-isopropylphenylmethyloxy, 4-isobutylphenylmethyloxy and α-naphthylmethyloxy.

Alkyl groups, aralkyl groups, aryl groups and alkoxy groups are exemplified in the same way as described earlier in the specification.

These groups can be easily introduced by substituting a halogen atom on a triazine ring with a compound that furnishes the corresponding substituent. For example, as shown in Schemes 3-a and 3-b below, by adding an aniline derivative and inducing a reaction, hyperbranched polymers (31), (32) having a phenylamino group on at least one chain end are obtained.

[Chemical Formula 22]

Scheme 3-a

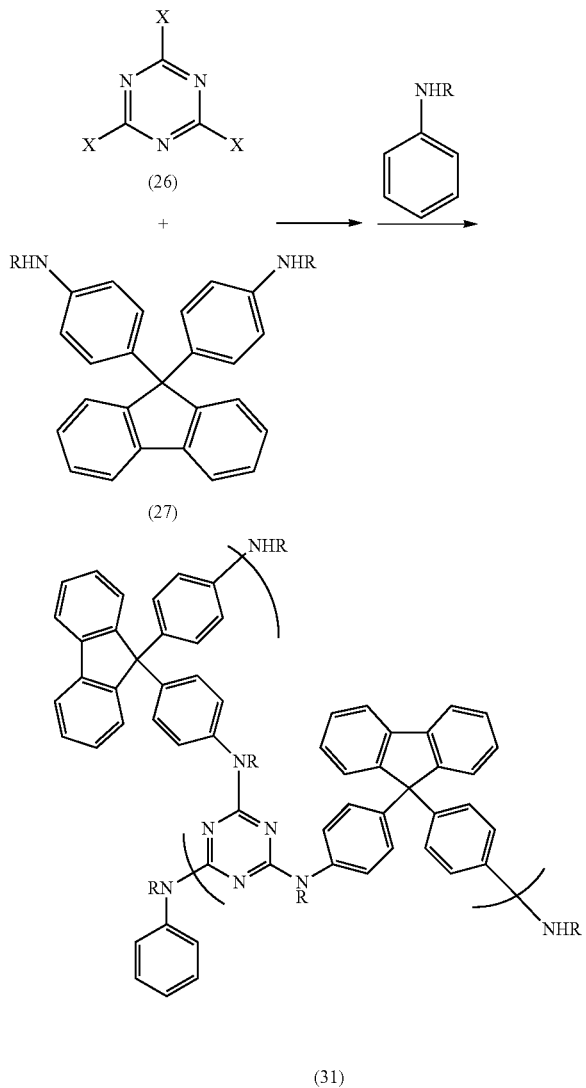

Scheme 3-b

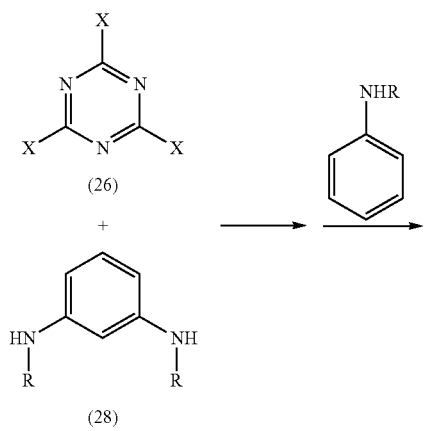

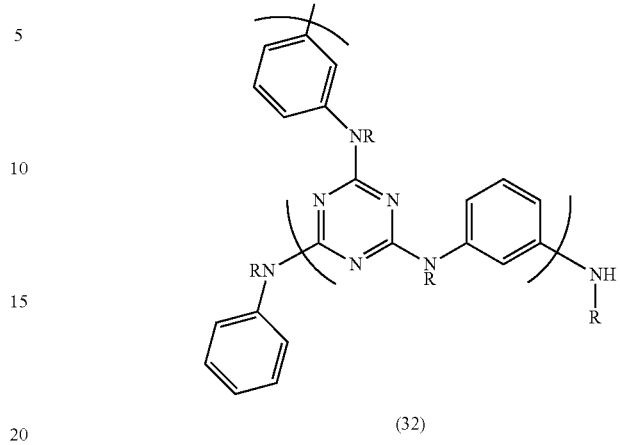

In these formulas, X and R are as defined above.

At this time, by reacting the cyanuric halide with a diaminoaryl compound while concurrently charging an organic monoamine, i.e., in the presence of an organic monoamine, it is possible to obtain a flexible hyperbranched polymer having a low degree of branching in which the rigidity of the hyperbranched polymer has been mitigated.

Because the hyperbranched polymer obtained in this way has an excellent solubility in a solvent (meaning that aggregation is inhibited) and has an excellent crosslinkability with a crosslinking agent, it is especially advantageous when used as a composition in combination with the subsequently described crosslinking agent.

An alkyl monoamine, aralkyl monoamine or aryl monoamine may be used here as the organic monoamine.

Illustrative examples of alkyl monoamines include methylamine, ethylamine, n-propylamine, isopropylamine, n-butylamine, isobutylamine, s-butylamine, t-butylamine, n-pentylamine, 1-methyl-n-butylamine, 2-methyl-n-butylamine, 3-methyl-n-butylamine, 1,1-dimethyl-n-propylamine, 1,2-dimethyl-n-propylamine, 2,2-dimethyl-n-propylamine, 1-ethyl-n-propylamine, n-hexylamine, 1-methyl-n-pentylamine, 2-methyl-n-pentylamine, 3-methyl-n-pentylamine, 4-methyl-n-pentylamine, 1,1-dimethyl-n-butylamine, 1,2-dimethyl-n-butylamine, 1,3-dimethyl-n-butylamine, 2,2-dimethyl-n-butylamine, 2,3-dimethyl-n-butylamine, 3,3-dimethyl-n-butylamine, 1-ethyl-n-butylamine, 2-ethyl-n-butylamine, 1,1,2-trimethyl-n-propylamine, 1,2,2-trimethyl-n-propylamine, 1-ethyl-1-methyl-n-propylamine, 1-ethyl-2-methyl-n-propylamine and 2-ethylhexylamine.

Illustrative examples of aralkyl monoamines include benzylamine, p-methoxycarbonylbenzylamine, p-ethoxycarbonylbenzylamine, p-methylbenzylamine, m-methylbenzylamine and o-methoxybenzylamine.

Illustrative examples of aryl monoamines include aniline, p-methoxycarbonylaniline, p-ethoxycarbonylaniline, p-methoxyaniline, 1-naphthylamine, 2-naphthylamine, anthranylamine, 1-aminopyrene, 4-biphenylylamine, o-phenylaniline, 4-amino-p-terphenyl and 2-aminofluorene.

In this case, the amount of organic monoamine used per equivalent of the cyanuric halide is set to preferably from 0.05 to 500 equivalents, more preferably from 0.05 to 120 equivalents, and even more preferably from 0.05 to 50 equivalents.

To suppress linearity and increase the degree of branching, the reaction temperature in this case is preferably from 60 to 150° C., more preferably from 80 to 150° C., and even more preferably from 80 to 120° C.

However, mixing of the three ingredients—an organic monoamine, a cyanuric halide and a diaminoaryl compound—may be carried out at a low temperature, in which case the temperature is set to preferably from about −50° C. to about 50° C., more preferably from about −20° C. to about 50° C., and even more preferably from about −20° C. to about 10° C. Following low-temperature charging, it is preferable to raise the temperature without interruption (in a single step) to the polymerization temperature and carry out the reaction.

Alternatively, the mixing of two ingredients—a cyanuric halide and a diaminoaryl Compound—may be carried out at a low temperature, in which case the temperature is set to preferably from about −50° C. to about 50° C., more preferably from about −20° C. to about 50° C., and even more preferably from about −20° C. to about 10° C. Following low-temperature charging, it is preferable to raise the temperature without interruption (in a single step) to the polymerization temperature and carry out the reaction.

The reaction of the cyanotic halide with the diaminoaryl compound in the presence of such an organic monoamine may be carried out using an organic solvent like those mentioned above.

The inorganic fine particles which, together with the above-described hyperbranched polymer, make up the inventive composition are not subject to any particular limitation. However, in this invention, an oxide, sulfide or nitride of one or more metal selected from the group consisting of Be, Al, Si, Ti, V, Fe, Cu, Zn, Y, Zr, Nb, Mo, In, Sn, Sb, Ta, W, Pb, Bi and Ce is preferred. Oxides of these metals are especially preferred.

A single type of inorganic fine particle may be used alone or two or more types may be used in combination.

Illustrative examples of metal oxides include $Al_2O_3$, ZnO, $TiO_2$, $ZrO_2$, $Fe_2O_3$, $Sb_2O_5$, BeO, ZnO, $SnO_2$, $CeO_2$, $SiO_2$ and $WO_3$.

Using a plurality of metal oxides as a complex oxide is also effective. As used herein, "complex oxide" refers to two or more inorganic oxides which have been mixed together in the fine particle production stage. Illustrative examples include complex oxides of $TiO_2$ with $ZrO_2$, of $TiO_2$ with $ZrO_2$ and $SnO_2$, and of $ZrO_2$ with $SnO_2$.

The metal oxide may also be a compound of two or more of the above metals, such as $ZnSb_2O_6$, $BaTiO_3$, $SrTiO_3$ and $SrSnO_3$. Such compounds may be used singly, or two or more may be used in admixture. Moreover, such compounds may be used in admixture with the above oxides.

No particular limitation is imposed on the size of the inorganic fine particles. However, to further increase their dispersibility in a dispersion, the particles have a primary particle size of preferably from 2 to 50 mm, and more preferably from 5 to 15 mm. The primary particle size is the value obtained by examination with a transmission electron microscope.

When the above inorganic fine particles are used, the particles may be used directly as is, or may be used in a colloidal state obtained by first dispersing the fine particles in water or an organic solvent (i.e., colloidal particles).

In addition, the inorganic fine particles used may be fine particles that have been treated with, for example, silicon oxide, an organosilicon compound or an organometallic compound.

"Treatment with silicon oxide" refers to growing fine particles of silicon oxide by a known process on the surface of the particles within an inorganic fine particle-containing dispersion, "Treatment with an organosilicon compound or an organometallic compound" refers to adding these compounds to an inorganic fine particle-containing dispersion, then stirring under applied heat.

The organosilicon compound is exemplified by silane coupling agents and silanes. Illustrative examples of silane coupling agents include vinyltrichlorosilane, vinyltrimethoxysilane, vinyltriethoxysilane, 2-(3,4-epoxycyclohexyl)ethyltrimethoxysilane, 3-glycidoxypropyltrimethoxysilane, 3-glycidoxypropylmethylditriethoxysilane, 3-glycidoxypropyltriethoxysilane, p-styryltrimethoxysilane, 3-methacryloxypropylmethyldimethoxysilane, 3-methacryloxypropyltrimethoxysilane, 3-methacryloxypropylmethyldiethoxysilane, 3-methacryloxypropyltriethoxysilane, 3-acryloxypropyltrimethoxysilane, N-2-(aminoethyl)-3-aminopropylmethyldimethoxysilane, N-2-(aminoethyl)-3-aminopropylmethyltrimethoxysilane, N-2-(aminoethyl)-3-aminopropylmethyltriethoxysilane, 3-aminopropyltrimethoxysilane, 3-aminopropyltriethoxysilane, 3-trimethoxysilyl-N-(1,3-dimethylbutylidene)propylamine, N-phenyl-3-aminopropyltrimethoxysilane, 3-chloropropyltrimethoxysilane, 3-mercaptopropylmethyldimethoxysilane, 3-mercaptopropyltrimethoxysilane, bis(triethoxysilylpropyl)tetrasulfide and 3-isocyanatopropyltriethoxysilane.

Illustrative examples of silanes include methyltrichlorosilane, dimethyldichlorosilane, trimethylchlorosilane, phenyltrichorosilane, methyltrimethoxysilane, dimethyldimethoxysilane, phenyltrimethoxysilane, methyltriethoxysilane, methyltriethoxysilane, dimethyldiethoxysilane, phenyltriethoxysilane, n-propyltrimethoxysilane, n-propyltriethoxysilane, hexyltrimethoxysilane, hexyltriethoxysilane, decyltrimethoxysilane, trifluoropropyltrimethoxysilane and hexamethyldisilazane.

The organometallic compound is exemplified by titanate coupling agents and aluminum coupling agents. Illustrative examples of titanate coupling agents include Plenact KR TTS, KR 46B, KR 38B, KR I38S, KR 238S, KR 338X, KR 44, KR 9SA, KR ET5 and KR ET (front Ajinomoto Fine-Techno Co., Inc.). Illustrative examples of aluminum coupling agents include Plenact AL-M (Ajinomoto Fine-Techno Co., Inc.).

These organosilicon compounds and organometallic compounds are used in an amount of preferably from 2 to 100 parts by weight per 100 parts by weight of the inorganic fine particles.

Metal oxide colloidal particles can be produced by a known method, such as an ion-exchange process, a peptization process, a hydrolysis process or a reaction process.

Ion-exchange processes are exemplified by methods involving the treatment of acidic salts of the above metals with a hydrogen ion-exchange resin, and methods involving the treatment of basic salts of the above metals with a hydroxyl anion-exchange resin.

Peptization processes are exemplified by methods that involve neutralizing acidic salts of the above metals with a base, methods that involve hydrolyzing alkoxides of the above metals, and methods that involve hydrolyzing basic salts of the above metals under heating, then removing unnecessary acid.

Reaction methods are exemplified by methods that involve reacting powders of the above metals with an acid.

The inventive film-forming composition which includes a triazine ring-containing hyperbranched polymer and inorganic fine particles is preferably a varnish obtained by the hybridization of these respective ingredients, which varnish is a uniform dispersion.

As used herein, "hybridization" refers broadly to mixing together solutes of differing character and having them intermingle in the state of a solution. So long as their dispersibilities are maintained, the differing solutes may or may not chemically or physically interact.

The method of hybridization is not subject to any particular limitation, provided stability is achieved in the final varnish.

Examples of methods of hybridization include: (1) mixing the triazine ring-containing hyperbranched polymer in a solid state into a dispersion of the inorganic fine particles, (2) mixing a solution of the triazine ring-containing hyperbranched polymer into a dispersion of the inorganic fine particles, and (3) adding the triazine ring-containing hyperbranched polymer in a solid state at the same time as an inorganic fine particle dispersing step to form a dispersion. From the standpoint of handleability, the method of mixing a solution of the triazine ring-containing hyperbranched polymer into a dispersion of the inorganic fine particles is preferred.

The stability of the final hybridized varnish should be such as to not give rise to any of the following: precipitation due to a decrease in dispersibility, a broad change in the primary particle size or secondary particle size, worsening of the coating properties, discoloration (whitening, yellowing), and worsening of the film quality.

The solvent used when hybridizing the triazine ring-containing hyperbranched polymer with the inorganic fine particles is not subject to any particular limitation, so long as the stability of the final varnish is not lost. In cases where a hyperbranched polymer solution and an inorganic fine particle dispersion are used to prepare the composition, the solvents used in each may be the same or may differ. However, to prevent a loss in stability, it is preferable for the solvents to be close in polarity. It is not desirable to use a solvent which clearly lowers the dispersibility of the Inorganic fine particle dispersion.

Illustrative examples of solvents which may be used include toluene, p-xylene, o-xylene, m-xylene, ethylbenzene, styrene, ethylene glycol dimethyl ether, propylene glycol monomethyl ether, ethylene glycol monomethyl ether, propylene glycol, propylene glycol monoethyl ether, ethylene glycol monoethyl ether, ethylene glycol monoisopropyl ether, ethylene glycol methyl ether acetate, propylene glycol monomethyl ether acetate, ethylene glycol ethyl ether acetate, diethylene glycol dimethyl ether, propylene glycol monobutyl ether, ethylene glycol monobutyl ether, diethylene glycol diethyl ether, dipropylene glycol monomethyl ether, diethylene glycol monomethyl ether, dipropylene glycol monoethyl ether, diethylene glycol monoethyl ether, triethylene glycol dimethyl ether, diethylene glycol monoethyl ether acetate, diethylene glycol, 1-octanol, ethylene glycol, hexylene glycol, trimethylene glycol, 1-methoxy-2-butanol, cyclohexanol, diacetone alcohol, furfuryl alcohol, tetrahydrofurfuryl alcohol, propylene glycol, benzyl alcohol, 1,3-butanediol, 1,4-butanediol, 2,3-butanediol, γ-butyrolactone, acetone, methyl ethyl ketone, methyl isopropyl ketone, diethyl ketone, methyl isobutyl ketone, methyl n-butyl ketone, cyclohexanone, ethyl acetate, isopropyl acetate, n-propyl acetate, isobutyl acetate, n-butyl acetate, ethyl lactate, methanol, ethanol, isopropanol, tert-butanol, allyl alcohol, n-propanol, 2-methyl-2-butanol, isobutanol, n-butanol, 2-methyl-1-butanol, 1-pentanol, 2-methyl-1-pentanol, 2-ethylhexanol, 1-methoxy-2-propanol, tetrahydrofuran, 1,4-dioxane, N,N-dimethylformamide, N,N-dimethylacetamide, N-methylpyrrolidone, 1,3-dimethyl-2-imidazolidinone, dimethylsulfoxide and N-cyclohexyl-2-pyrrolidinone. These may be used singly as two or more may be used in combination.

The content of inorganic fine particles in the composition should be within a range that does not compromise the dispersibility of the final varnish that is obtained, and may be controlled in accordance with the target refractive index, transmittance and heat resistance of the film to be produced. For example, when the amount (solids basis) of the triazine ring-containing hyperbranched polymer is set to 100 parts by weight, the inorganic fine particles may be added in the range of from 0.1 to 1,000 parts by weight, and preferably from 1 to 500 parts by weight. To maintain the film quality and obtain a stable refractive index, addition in an amount of from 10 to 300 parts by weight is more preferred.

When hybridizing the triazine ring-containing hyperbranched polymer and the dispersion of inorganic fine particles, the subsequently described surfactants and other ingredients such as antisettling agents and emulsifiers may be added in order to increase the dispersibility or to increase the compatibility.

Aside from a triazine ring-containing hyperbranched polymer, inorganic fine particles and a solvent, the film-forming composition of the invention may include also other ingredients, such as a leveling agent, a surfactant and a crosslinking agent, provided this does not interfere with the advantageous effects of the invention.

Illustrative examples of surfactants include the following nonionic surfactants: polyoxyethylene alkyl ethers such as polyoxyethylene lauryl ether, polyoxyethylene stearyl ether, polyoxyethylene cetyl ether and polyoxyethylene oleyl ether; polyoxyethylene alkylaryl ethers such as polyoxyethylene octylphenol ether and polyoxyethylene nonylphenyl ether; polyoxyethylene-polyoxypropylene block copolymers; sorbitan fatty acid esters such as sorbitan monolaurate, sorbitan monopalmitate, sorbitan monostearate, sorbitan monooleate, sorbitan trioleate and sorbitan tristearate; and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate; and additionally include fluorosurfactants such as those available under the trade names Eftop EF301, EF303 and EF352 (from Mitsubishi Materials Electronic Chemicals Co., Ltd. (formerly Jemco Inc.)), Megafac F171, F173, R-08 and R-30 (DIC Corporation), Fluorad FC430 and FC431 (Sumitomo 3M, Ltd.), AsahiGuard AG710 and Surflon S-382, SC101, SC102, SC103, SC104, SC105 and SC106 (Asahi Glass Co., Ltd.); and also the organosiloxane polymers KP341 (Shin-Etsu Chemical Co., Ltd.) and BYK-302, BYK-307, BYK-322, BYK-323, BYK-330, BYK-333, BYK-370, BYK-375 and BYK-378 (BYK-Chemie Japan KK).

These surfactants may be used singly or two or more may be used in combination. The amount of surfactant used per 100 parts by weight of the hyperbranched polymer is preferably from 0.0001 to 5 parts by weight, more preferably from 0.001 to 1 part by weight, and even more preferably from 0.01 to 0.5 part by weight.

The crosslinking agent is not particularly limited, provided it is a compound having a substituent capable of reacting with the hyperbranched polymer of the invention. Such compounds are exemplified by melamine compounds having a crosslink-forming substituent such as a methylol group or a methoxymethyl group, substituted urea compounds, compounds containing a crosslink-forming substituent such as an epoxy group or an oxetane group, compounds containing a blocked isocyanate group, compounds having an acid anhydride group, compounds having a (meth)acryl group, and phenoplast compounds. From the standpoint of heat resistance and storage stability, a compound containing an epoxy group, a blocked isocyanate group or a (meth)acryl group is preferred.

A blocked isocyanate group is also preferred in that, because it crosslinks by forming a urea linkage and has a carbonyl group, the refractive index does not decrease.

When used in the treatment of polymer chain ends, it suffices for these compounds to have at least one crosslink-forming substituent; however, when used in cross linking treatment between polymers, they must have at least two crosslink-forming substituents.

The epoxy compound has at least two epoxy groups on the molecule. Upon exposure of this compound to an elevated temperature during heat curing, the epoxy rings open and the crosslinking reaction proceeds via an addition reaction with the hyperbranched polymer used in the invention.

Illustrative examples of the crosslinking agent include tris(2,3-epoxypropyl) isocyanate, 1,4-butanediol diglycidyl ether, 1,2-epoxy-4-(epoxyethyl)cyclohexane, glycerol triglycidyl ether, diethylene glycol diglycidyl ether, 2,6-diglycidylphenyl glycidyl ether, 1,1,3-tris[p-(2,3-epoxypropoxy)phenyl]propane, 1,2-cyclohexanedicarboxylic acid diglycidyl ester, 4,4'-methylenebis(N,N-diglycidylaniline), 3,4-epoxycyclohexylmethyl-3,4-epoxycyclohexanecarboxylate, trimethylolethane triglycidyl ether, bisphenol A diglycidyl ether and pentaerythritol polyglycidyl ether.

Examples of commercial products that may be used include epoxy resins having at least two epoxy groups, such as YH-434 and YH-434L (from Tohto Kasei Co., Ltd.); epoxy resins having a cyclohexene oxide structure, such as Epolead GT-401, GT-403, GT-301 and GT-302, and also Celloxide 2021 and Celloxide 3000 (all from Daicel Chemical Industries, Ltd.); bisphenol A-type epoxy resins such as Epikote (now "jER") 1001, 1002, 1003, 1004, 1007, 1009, 1010 and 828 (all from Japan Epoxy Resin Co., Ltd.); bisphenol F-type epoxy resins such as Epikote (now "jER") 807 (Japan Epoxy Resin Co., Ltd.); phenol-novolak type epoxy resins such as Epikote (now "jER") 152 and 154 (Japan Epoxy Resin Co., Ltd.), and EPPN 201 and 202 (Nippon Kayaku Co., Ltd.); cresol-novolak type epoxy resins such as EOCN-102, EOCN-103S, EOCN-104S, EOCN-1020, EOCN-1025 and EOCN-1027 (Nippon Kayaku Co., Ltd.), and Epikote (now "jER") 180S75 (Japan Epoxy Resin Co., Ltd.); alicyclic epoxy resins such as Denacol EX-252 (Nagase ChemteX Corporation), CY175, CY177 and CY179 (Ciba-Geigy AG), Araldite CY-182, CY-192 and CY-184 (Ciba-Geigy AG), Epiclon 200 and 400 (DIC Corporation), Epikote (now "jER") 871 and 872 (Japan Epoxy Resin Co., Ltd.), and ED-5661 and ED-5662 (Celanese Coating KK); and aliphatic polyglycidyl ethers such as Denacol EX-611, EX-612, EX-614, EX-622, EX-411, EX-512, EX-522, EX-421, EX-313, EX-314 and EX-321 (Nagase ChemteX Corporation).

The acid anhydride compound is a carboxylic acid anhydride obtained by carrying out a dehydration/condensation reaction between two carboxylic acid molecules. Upon exposure to an elevated temperature during heat curing, the anhydride ring opens and the crosslinking reaction proceeds by way of an addition reaction with the hyperbranched polymer used in this invention.

Illustrative examples of the acid anhydride compound include compounds having a single acid anhydride group on the molecule, such as phthalic anhydride, tetrahydrophthalic anhydride, hexahydrophthalic anhydride, methyl tetrahydrophthalic anhydride, methyl hexahydrophthalic anhydride, nadic anhydride, methyl nadic anhydride, maleic anhydride, succinic anhydride, octyl succinic anhydride and dodecenyl succinic anhydride; and compounds having two acid anhydride groups on the molecule, such as 1,2,3,4-cyclobutanetetracarboxylic dianhydride, pyromellitic anhydride, 3,4-dicarboxy-1,2,3,4-tetrahydro-1-naphthalenesuccinic dianhydride, bicyclo[3.3.0]octane-2,4,6,8-tetracarboxylic dianhydride, 5-(2,5-dioxotetrahydro-3-furanyl)-3-methyl-3-cyclohexene-1,2-dicarboxylic anhydride, 1,2,3,4-butanetetracarboxylic dianhydride, 3,3',4,4'-benzophenonetetracarboxylic dianhydride, 3,3',4,4'-biphenyltetracarboxylic dianhydride, 2,2-bis(3,4-dicarboxyphenyl)hexafluoropropane dianhydride and 1,3-dimethyl-1,2,3,4-cyclobutanetetracarboxylic dianhydride.

The (meth)acrylic compound is a compound having two or more (meth)acryl groups on the molecule. Upon exposure to an elevated temperature during heat curing, the crosslinking reaction proceeds by way of an addition reaction with the hyperbranched polymer used in the invention.

Illustrative examples of the compound having (meth)acryl groups include ethylene glycol diacrylate, ethylene glycol dimethacrylate, polyethylene glycol diacrylate, polyethylene glycol dimethacrylate, ethoxylated bisphenol A diacrylate, ethoxylated bisphenol A dimethacrylate, ethoxylated trimethylolpropane triacrylate, ethoxylated trimethylolpropane trimethacrylate, ethoxylated glycerol triacrylate, ethoxylated glycerol trimethacrylate, ethoxylated pentaerythritol tetraacrylate, ethoxylated pentaerythritol tetramethacrylate, ethoxylated dipentaerythritol hexaacrylate, polyglycerol monoethylene oxide polyacrylate, polyglycerol polyethylene glycol polyacrylate, dipentaerythritol hexaacrylate, dipentaerythritol hexamethacrylate, neopentyl glycol diacrylate, neopentyl glycol dimethacrylate, pentaerythritol, triacrylate, pentaerythritol trimethacrylate, trimethylolpropane triacrylate, trimethylolpropane trimethacrylate, tricyclodecane dimethanol diacrylate, tricyclodecane dimethanol dimethacrylate, 1,6-hexanediol diacrylate and 1,6-hexanediol dimethacrylate.

The above compound having (meth)acryl groups may be acquired as a commercial product, illustrative examples of which include NK Ester A-200, A-400, A-600, A-1000, A-TMPT, UA-53H, 1G, 2G, 3G, 4G, 9G, 14G, 23G, ABE-300, A-BPE-4, A-BPE-6, A-BPE-10, A-BPE-20, A-BPE-30, BPE-80N, BPE-100N, BPE-200, BPE-500, BPE-900, BPE-1300N, A-GLY-3E, A-GLY-9E, A-GLY-20E, A-TMPT-3EO, A-TMPT-9EO, ATM-4E and ATM-35E (all from Shin-Nakamura Chemical Co., Ltd.); KAYARAD™ DPEA-12, PEG400DA, THE-330 and RP-1040 (all from Nippon Kayaku Co., Ltd.); M-210 and M-350 (from Toagosei Co., Ltd.); KAYARAD™ DPHA, NPGDA and PET30 (Nippon Kayaku Co., Ltd.); and NK Ester A-DPH, A-TMPT, A-DCP, A-HD-N, TMPT, DCP, NPG and HD-N (all from Shin-Nakamura Chemical Co., Ltd.).

The compound containing blocked isocyanate groups is a compound having on the molecule at least two blocked isocyanate groups, i.e., isocyanate groups (—NCO) that have been blocked with, a suitable protecting group, and in which, upon exposure of the compound to an elevated temperature during heat curing, the protecting groups (blocking moieties) are removed by thermal dissociation and the isocyanate groups that form as a result induce crosslinking reactions with the resin. This compound is exemplified by compounds having on the molecule at least two groups of the following formula (which groups may be the same or may each differ).

[Chemical Formula 23]

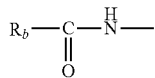

In the formula, $R_b$ is an organic group on the blocking moiety.

Such a compound can be obtained, by, for example, reacting a suitable blocking agent with a compound having at least two isocyanate groups on the molecule.

Illustrative examples of compounds having at least two isocyanate groups on the molecule include polyisocyanates such as isophorone diisocyanate, 1,6-hexamethylene diisocyanate, methylenebis(4-cyclohexyl isocyanate) and trimethylhexamethylene diisocyanate, and also dimers and trimers thereof, as well as the reaction products of these with diols, triols, diamines or triamines.

Illustrative examples of the blocking agent include alcohols such as methanol, ethanol, isopropanol, n-butanol, 2-ethoxyhexanol, 2-N,N-dimethylaminoethanol, 2-ethoxyethanol and cyclohexanol; phenols such as phenol, o-nitrophenol, p-chlorophenol, and o-, m- or p-cresol; lactams such as ε-caprolactam; oximes such as acetone oxime, methyl ethyl ketone oxime, methyl isobutyl ketone oxime, cyclohexanone oxime, acetophenone oxime and benzophenone oxime; pyrazoles such as pyrazole, 3,5-dimethylpyrazole and 3-methylpyrazole; and thiols such as dodecanethiol and benzenethiol.

The compound containing blocked isocyanates may also be acquired as a commercial product, illustrative examples of which include B-830, B-815N, B-842N, B-870N, B-874N, B-882N, B-7005, B7030, B-7075 and B-5010 (all from Mitsui Chemicals Polyurethane, Inc.); Duranate™ 17B-60PX, TPA-B80E, MF-B60X, MF-K60X and E402-B80T (all from Asahi Kasei Chemicals Corporation); and KarenzMOI-BM™ (Showa Denko KK).

Aminoplast compounds are compounds which have at least two methoxymethylene groups on the molecule. Upon exposure to an elevated temperature during heat curing, crosslinking reactions proceed by way of demethanolization/condensation reactions with the hyperbranched polymer used in the invention.

Illustrative examples of melamine compounds include the Cymel series, such as hexamethoxymethylmelamine (Cymel™ 303), tetrabutoxymethylglycoluril (Cymel™ 1170) and tetramethoxymethylbenzoguanamine (Cymel™ 1123) (all from Nihon Cytec Industries, Inc.); and the Nikalac™ series, including the methylated melamine resins Nikalac™ MW-30HM, MW-390, MW-100LM and MX-750LM, and the methylated urea resins Nikalac™ MX-270, MX-280 and MX-290 (all from Sanwa Chemical Co., Ltd.).

Oxetane compounds are compounds which have at least two oxetanyl groups on the molecule. Upon exposure to an elevated temperature during heat curing, crosslinking reactions proceed by way of addition reactions with the hyperbranched polymer used in the invention.

Examples of compounds having oxetane groups include the oxetane group-bearing compounds OXT-221, OX-SQ-H and OX-SC (from Toagosei Co., Ltd.).

Phenoplast compounds are compounds which have at least two hydroxymethylene groups on the molecule. Upon exposure to an elevated temperature during heat curing, crosslinking reactions proceed by way of dehydration/condensation reactions with the hyperbranched polymer used in the invention.

Illustrative examples of phenoplast compounds include 2,6-dihydroxymethyl-4-methylphenol, 2,4-dihydroxymethyl-6-methylphenol, bis(2-hydroxy-3-hydroxymethyl-5-methylphenyl)methane, bis(4-hydroxy-3-hydroxymethyl-5-methylphenyl)methane, 2,2-bis(4-hydroxy-3,5-dihydroxymethylphenyl)propane, bis(3-formyl-4-hydroxyphenyl)methane, bis(4-hydroxy-2,5-dimethylphenyl)fomrylmethane and α,α-bis(4-hydroxy-2,5-dimethylphenyl)-4-formyltoluene.

The phenoplast compound may also be acquired as a commercial product, illustrative examples of which include 26DMPC, 46DMOC, DM-BIPC-F, DM-BIOC-F, TM-BIP-A, BISA-F, BI25X-DF and BI25X-TPA (all from Asahi Organic Chemicals Industry Co., Ltd.).

These crosslinking agents may be used singly or two or more may be used in combination. The amount of crosslinking agent used per 100 parts by weight of the hyperbranched polymer is preferably from 1 to 100 parts by weight. From the standpoint of the solvent resistance, the lower limit is preferably 10 parts by weight, and more preferably 20 parts by weight. From the standpoint of control of the refractive index, the upper limit is preferably 50 parts by weight, and more preferably 30 parts by weight.

When a crosslinking agent is used, the crosslinking agent reacts with reactive end-group substituents on the hyperbranched polymer, which may make it possible to achieve such advantageous effects as increasing the film density, increasing the heat resistance and increasing the thermal relaxation properties.

Ingredients other than the above may also be added in any step during preparation of the inventive composition.

The film-forming composition of the invention, by being applied onto a base material and subsequently heated where necessary, is able to form a desired film.

Any suitable method may be used for applying the composition, such as spin coating, dipping, flow coating, inkjet printing, spraying, bar coating, gravure coating, slit coating, roll coating, transfer printing, brush coating, blade coating and air knife coating.

Illustrative examples of the base material include silicon, indium-tin oxide (ITO)-coated glass, indium zinc oxide (IZO)-coated glass, polyethylene terephthalate (PET), plastic, glass, quartz and ceramic. Use can also be made of a flexible base material having pliability.

The temperature at which baking is carried out in order to evaporate the solvent is not subject to any particular limitation. For example, baking may be carried out at between 40 and 400° C. In such cases, to achieve more uniform film formability or to induce the reaction to proceed on the base material, temperature change may be carried out in two or more stages.

The baking process is not particularly limited. For example, solvent evaporation may be effected using a hot plate or an oven, and under a suitable atmosphere, such as in open air, in nitrogen or another inert gas, or in a vacuum.

As for the bake temperature and time, conditions which are compatible with the processing steps for the target electronic device should be selected. Bake conditions such that the physical values of the resulting film conform to the required characteristics of the electronic device should be selected.

Because the film made of the inventive composition that has been obtained in this way is able to achieve a high heat resistance, high transparency, high refractive index, high solubility and low volume shrinkage, it can be advantageously used as a component in the fabrication of electronic devices such as liquid-crystal displays, organic electroluminescent (EL) displays, optical semiconductor (LED) devices, solid-state image sensors, organic thin-film solar cells, dye-sensitized solar cells and organic thin-film transistors (TFT).

Where necessary, other resins (thermoplastic resins or thermoset resins) may be included in the inventive composition.

Illustrative, non-limiting, examples of such other resins include the following thermoplastic resins: polyolefin resins such as polyethylene (PE), polypropylene (PP), ethylene-vinyl acetate copolymers (EVA), and ethylene-ethyl acrylate copolymers (EEA); polystyrene resins such as polystyrene (PS), high-impact polystyrene (HIPS), acrylonitrile-styrene copolymers (AS), acrylonitrile-butadiene-styrene copolymers (ABS) and methyl methacrylate-styrene copolymers (MS); polycarbonate resins; vinyl chloride resins; polyamide resins; polyimide resins; (meth)acrylic resins such as polymethyl methacrylate (PMMA); polyester resins such as polyethylene terephthalate (PET), polybutylene terephthalate, polyethylene naphthalate, polybutylene naphthalate, polylactic acid (PLA), poly-3-hydroxybutyric acid, polycaprolactone, polybutylene succinate and polyethylene succinate/adipate; polyphenylene ether resins; modified polyphenylene ether resins; polyacetal resins; polysulfone resins; polyphenylene sulfide resins; polyvinyl alcohol resins; polyglycolic acid; modified starch; cellulose acetate and cellulose triacetate; chitin and chitosan; and lignin. Other exemplary resins include also thermoset resins such as phenolic resins, urea resins, melamine resins, unsaturated polyester resins, polyurethane resins and epoxy resins.

These resins may be used singly or two or more may be used in combination. The amount in which such resins are used per 100 parts by weight of the hyperbranched polymer is preferably from 1 to 10,000 parts by weight, and more preferably from 1 to 1,000 parts by weight.

For example, a composition with a (meth)acrylic resin may be obtained by including a (meth)acrylate compound in the composition and polymerizing the (meth)acrylate compound.

Illustrative examples of (meth)acrylate compounds include methyl (meth)acrylate, ethyl (meth)acrylate, ethylene glycol di(meth)acrylate, tetraethylene glycol di(meth)acrylate, polyethylene glycol di(meth)acrylate, propylene glycol di(meth)acrylate, polypropylene glycol di(meth)acrylate, 1,4-butanediol di(meth)acrylate, 1,6-hexanediol di(meth)acrylate, neopentylglycol di(meth)acrylate, trimethylolpropane trioxyethyl (meth)acrylate, tricyclodecane dimethanol di(meth)acrylate, tricyclodecanyl di(meth)acrylate, trimethylolpropane trioxypropyl (meth)acrylate, tris-2-hydroxyethyl isocyanurate tri(meth)acrylate, tris-2-hydroxyethyl isocyanurate di(meth)acrylate, 1,9-nonanediol di(meth)acrylate, pentaerythritol di(meth)acrylate, glycerol methacrylate acrylate, pentaerythritol tri(meth)acrylate, trimethylolpropane trimethacrylate, allyl (meth)acrylate, vinyl (meth)acrylate, epoxy (meth)acrylate, polyester (meth)acrylate and urethane (meth)acrylate.

The polymerization of these (meth)acrylate compounds may be carried out by light irradiation or heating in the presence of a photoradical initiator or a thermal radical initiator.

Examples of photoradical initiators include acetophenones, benzophenones, Michler's benzoyl benzoate, amyloxime ester, tetramethylthiuram monosulfide and thioxanthones.

Photocleavable photoradical initiators are especially preferred. Photocleavable photoradical initiators are listed on page 159 of Saishin UV Kōka Gijutsu [Recent UV Curing Technology] (publisher, K. Takansu; published by Gijutsu Joho Kyokai KK; 1991).

Examples of commercial photoradical initiators include those available from BASF under the trade names Irgacure 184, 369, 651, 500, 819, 907, 784 and 2959, the trade names CGI1700, CGI1750, CGI1850 and CG24-61, the trade names Darocur 1116 and 1173, and the trade name Lucirin TPO; that available from UCB under the trade name Ubecryl P36; and those available under the trade names Esacure KIP150, KIP65LT, KIP100F, KT37, KT55, KTO46 and KIP75/B from the Fratelli Lamberti Company.

The photoradical initiator is used in the range of preferably from 0.1 to 15 parts by weight, and more preferably from 1 to 10 parts by weight, per 100 parts by weight of the (meth)acrylate compound.

The solvent used in polymerization is exemplified by the same solvents as those mentioned above for the film-forming composition.

EXAMPLES

The invention is illustrated more fully below by way of Working Examples of the invention and Comparative Examples, although the invention is not limited by these Examples. The instruments used for measurement in the Examples were as follows.

$^1$H-NMR
   Instruments: Varian NMR System 400 NB (400 MHz)
      JEOL-ECA700 (700 MHz)
   Solvent used in measurement: DMSO-d6
   Reference material: Tetramethylsilane (TMS) (δ=0.0 ppm)

GPC
   Instrument HLC-8200 GPC (Tosoh Corporation)
   Columns: Shodex KF-804L+KF-805L
   Column temperature: 40° C.
   Solvent: Tetrahydrofuran (THF)
   Detector: UV (254 nm)
   Calibration curve: polystyrene standard Ultraviolet-Visible Spectrophotometer
   Instrument: Shimadzu UV-3600 (Shimadzu Corporation)

Ellipsometer
   Instrument: VASE multiple incident angle spectroscopic ellipsometer (JA Woollam Japan)

Transmission Electron Microscope
   Instrument: JEM-1010 (JEOL Ltd.)

[1] Synthesis of Hyperbranched Polymer

Synthesis Example 1

Synthesis of Triazine Ring-Containing Hyperbranched Polymer [3]

[Chemical Formula 24]

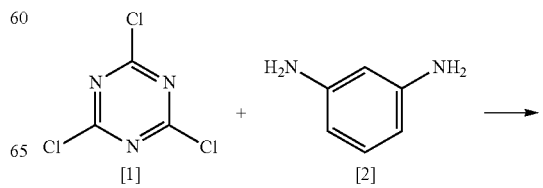

-continued

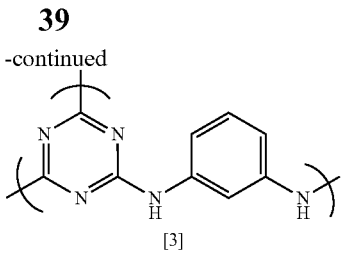

[3]

Under an air atmosphere, 28.94 g of m-phenylenediamine [2] (0.27 mol, Aldrich) was added to a 1,000 mL four-neck flask, dissolved in 121 mL of N,N-dimethylacetamide (DMAc), and heated to 100° C. on an oil bath. Next, 36.91 g of 2,4,6-trichloro-1,3,5-triazine [1] (0.20 mol; Tokyo Chemical Industry) dissolved in 261.5 mL of DMAc was added and polymerization was started.

After 50 minutes, 56.53 g of aniline (0.6 mol; Junsei Chemical Co., Ltd.) was added and the flask contents were stirred for 1 hour, stopping polymerization. The reaction mixture was allowed to cool to room temperature, then was reprecipitated in a mixed solution of 28% ammonia water (30.4 g) dissolved in 1,600 mL of water and 520 mL of methanol. The precipitate was collected by filtration, re-dissolved in 400 mL of THF and 15 mL of N,N-dimethyl-formamide, then reprecipitated in 2,100 mL of ion-exchanged water. The resulting precipitate was collected by filtration and dried in a vacuum desiccator at 150° C. for 6 hours, yielding 49.78 g of the target polymeric compound [3] (abbreviated below as "HB-TmDA45"). FIG. 1 shows the measured $^1$H-NMR spectrum for HB-TmDA45. The HB-TmDA45 thus obtained was a compound having structural units of formula (24). The polystyrene-equivalent weight-average molecular weight Mw of HB-TmDA45, as measured by GPC, was 4,600, and the polydispersity Mw/Mn was 2.37.

An amount of 1.0 g of the HB-TmDA45 thus obtained was dissolved in 9.0 g of cyclohexanone (CHN), giving a clear, light yellow-colored solution. Using a spin coater, the resulting polymer varnish was spin-coated onto a glass substrate for 5 seconds at 200 rpm and for 30 seconds at 2,000 rpm, following which the solvent was removed by a 2-minute bake at 150° C. and a 5-minute bake at 250° C., thereby forming a film. The resulting film had a refractive index at 550 nm of 1.8030.

The following titania dispersions (1) to (3) were used in the examples described below.

Titania Dispersion (1): A 1-methoxy-2-propanol dispersion containing 10.5 wt % of colloidal particles of anatase-type titania (primary particle size, 6 to 10 nm).

Titania Dispersion (2): A 1-methoxy-2-propanol dispersion containing 10.5 wt % of colloidal particles of rutile-type titania (primary particle size, 6 to 10 nm).

Titania Dispersion (3): A 1-methoxy-2-propanol dispersion containing 20.5 wt % of colloidal particles (primary particle size, 6 to 10 nm) of a complex oxide of titanium oxide, zirconium oxide and tin oxide ($TiO_2:ZrO_2:SnO_2=1:0.2:0.1$, by weight).

[2] Production of Film-Forming Composition and Film

Example 1

A 20% CNH solution of HB-TmDA45 was prepared by weighing out 2.0000 g of the HB-TmDA45 obtained in Synthesis Example 1 into a 20 mL pear-shaped flask, then adding 10.0000 g of CHN and effecting complete dissolution at room temperature.

A varnish (abbreviated below as "HB1-100") having a total solids content of 8.0 wt % was obtained by weighing out 2.0000 g of the 20% CHN solution of HB-TmDA45 prepared above into a 20 mL pear-shaped flask, adding 3.8095 g of Titania Dispersion (1) (the solids content of the inorganic fine particles, relative to the solids content of the HB-TmDA45, being 100 parts by weight), adding 0.0400 g of a solution obtained by diluting BYK-307 (BYK-Chemie Japan KK) as the surfactant with 1-methoxy-2-propanol (PGME) to a concentration by weight of 0.1%, then adding 4.1555 g of PGME and mixing to complete uniformity at room temperature.

Using a spin coater, the resulting HB1-100 varnish was spin-coated onto silicon substrates or quartz substrates for 30 seconds at 3,000 rpm. Next, using a hot plate, the respective varnish-coated substrates were subjected to, respectively: A) a 1-minute bake at 100° C., B) a 1-minute bake at 100° C. followed by a 5-minute bake at 200° C., C) a 1-minute bake at 100° C. followed by a 5-minute bake at 250° C., or D) a 1-minute bake at 100° C. followed by a 5-minute bake at 300° C., thereby forming films.

Example 2

A varnish (abbreviated below as "HB1-200") having a total solids content of 8.0 wt % was obtained by weighing out 1.5000 g of a 20% CHN solution of HB-TmDA45 prepared in the same way as in Example 1 into a 20 mL pear-shaped flask, adding 5.7143 g of Titania Dispersion (1) (the solids content of the inorganic fine particles, relative to the solids content of the HB-TmDA45, being 200 parts by weight), adding 0.0300 g of a solution obtained by diluting BYK-307 (BYK-Chemie Japan KK) as the surfactant with PGME to a concentration by weight of 0.1%, then adding 4.0095 g of PGME and mixing to complete uniformity at room temperature.

Aside from using the HB1-200 varnish thus obtained, the varnish was spin-coated onto silicon substrates or quartz substrates in the same way as in Example 1, following which baking was carried out under the same respective conditions A), B), C) and D) as in Example 1, thereby forming films.

Example 3

A varnish (abbreviated below as "HB1-300") having a total solids content of 8.0 wt % was obtained by weighing out 1.0000 g of a 20% CHN solution of HB-TmDA45 prepared in the same way as in Example 1 into a 20 mL pear-shaped flask, adding 5.7143 g of Titania Dispersion (1) (the solids content of the inorganic fine particles, relative to the solids content of the HB-TmDA45, being 300 parts by weight), adding 0.0200 g of a solution, obtained by diluting BYK-307 (BYK-Chemie Japan KK) as the surfactant with PGME to a concentration by weight of 0.1%, then adding 3.2682 g of PGME and mixing to complete uniformity at room temperature.

Aside from using the HB1-300 varnish thus obtained, the varnish was spin-coated onto silicon substrates or quartz substrates in the same way as in Example 1, following which baking was carried out under the same respective conditions A), B), C) and D) as in Example 1, thereby forming films.

Example 4

A varnish (abbreviated below as "HB2-100") having a total solids content of 8.0 wt % was obtained by weighing out 2.0000 g of a 20% CHN solution of HB-TmDA45 prepared in the same way as in Example 1 into a 20 mL pear-shaped flask, adding 3.8095 g of Titania Dispersion (2) (the solids content of the inorganic fine particles, relative to the solids content of the HB-TmDA45, being 100 parts by weight), adding 0.0400 g of a solution obtained by diluting BYK-307 (BYK-Chemie Japan KK) as the surfactant with PGME to a concentration by weight of 0.1%, then adding 4.1555 g of PGME and mixing to complete uniformity at room temperature.

Aside from using the HB2-100 varnish thus obtained, the varnish was spin-coated onto silicon substrates or quartz substrates in the same way as in Example 1, following which baking was carried out under the same respective conditions A), B), C) and D) as in Example 1, thereby forming films.

Example 5

A varnish (abbreviated below as "HB2-200") having a total solids content of 8.0 wt % was obtained by weighing out 1.5000 g of a 20% CHN solution of HB-TmDA45 prepared in the same way as in Example 1 into a 20 mL pear-shaped flask, adding 5.7143 g of Titania Dispersion (2) (the solids content of the inorganic fine particles, relative to the solids content of the HB-TmDA45, being 200 parts by weight), adding 0.0300 g of a solution obtained by diluting BYK-307 (BYK-Chemie Japan KK) as the surfactant with PGME to a concentration by weight of 0.1%, then adding 4.0095 g of PGME and mixing to complete uniformity at room temperature.

Aside from using the HB2-200 varnish thus obtained, the varnish was spin-coated onto silicon substrates or quartz substrates in the same way as in Example 1, following which baking was carried out under the same respective conditions A), B), C) and D) as in Example 1, thereby forming films.

Example 6

A varnish (abbreviated below as "HB2-300") having a total solids content of 8.0 wt % was obtained by weighing out 1.0000 g of a 20% CHN solution of HB-TmDA45 prepared in the same way as in Example 1 into a 20 mL pear-shaped flask, adding 5.7143 g of Titania Dispersion (2) (the solids content of the inorganic fine particles, relative to the solids content of the HB-TmDA45, being 300 parts by weight), adding 0.0200 g of a solution obtained by diluting BYK-307 (BYK-Chemie Japan KK) as the surfactant with PGME to a concentration by weight of 0.1%, then adding 3.2682 g of PGME and mixing to complete uniformity at room temperature.

Aside from using the HB2-300 varnish thus obtained, the varnish was spin-coated onto silicon substrates or quartz substrates in the same way as in Example 1, following which baking was carried out under the same respective conditions A), B), C) and D) as in Example 1, thereby forming films.

Example 7

A varnish (abbreviated below as "HB3-100") having a total solids content of 8.0 wt % was obtained by weighing out 2.0000 g of a 20% CHN solution of HB-TmDA45 prepared in the same way as in Example 1 into a 20 mL pear-shaped flask, adding 1.9512 g of Titania Dispersion (3) (the solids content of the inorganic fine particles, relative to the solids content of the HB-TmDA45, being 100 parts by weight), adding 0.0400 g of a solution obtained by diluting BYK-307 (BYK-Chemie Japan KK) as the surfactant with PGME to a concentration by weight of 0.1%, then adding 6.0138 g of PGME and mixing to complete uniformity at room temperature.

Aside from using the HB3-100 varnish thus obtained, the varnish was spin-coated onto silicon substrates or quartz substrates in the same way as in Example 1, following which baking was carried out under the same respective conditions A), B), C) and D) as in Example 1, thereby forming films.

Example 8

A varnish (abbreviated below as "HB3-200") having a total solids content of 8.0 wt % was obtained by weighing out 1.5000 g of a 20% CHN solution of HB-TmDA45 prepared in the same way as in Example 1 into a 20 ml pear-shaped flask, adding 2.9268 g of Titania Dispersion (3) (the solids content of the inorganic fine particles, relative to the solids content of the HB-TmDA45, being 200 parts by weight), adding 0.0300 g of a solution obtained by diluting BYK-307 (BYK-Chemie Japan KK) as the surfactant with PGME to a concentration by weight of 0.1%, then adding 6.7969 g of PGME and mixing to complete uniformity at room temperature.

Aside from using the HB3-200 varnish thus obtained, the varnish was spin-coated onto silicon substrates or quartz substrates in the same way as in Example 1, following which baking was carried out under the same respective conditions A), B), C) and D) as in Example 1, thereby forming films.

Example 9

A varnish (abbreviated below as "HB3-300") having a total solids content of 8.0 wt % was obtained by weighing out 1.0000 g of a 20% CHN solution of HB-TmDA45 prepared in the same way as in Example 1 into a 20 mL pear-shaped flask, adding 2.9268 g of Titania Dispersion (3) (the solids content of the inorganic fine particles, relative to the solids content of the HB-TmDA45, being 300 parts by weight), adding 0.0200 g of a solution obtained by diluting BYK-307 (BYK-Chemie Japan KK) as the surfactant with PGME to a concentration by weight of 0.1%, then adding 6.0557 g of PGME and mixing to complete uniformity at room temperature.

Aside from using the HB3-300 varnish thus obtained, the varnish was spin-coated onto silicon substrates or quartz substrates in the same way as in Example 1, following which baking was carried out under the same respective conditions A), B), C) and D) as in Example 1, thereby forming films.

Comparative Example 1

A varnish (abbreviated below as "PSQ1-300") having a total solids content of 8.0 wt % was obtained by weighing out 0.5000 g of a solution of phenysilsesquioxane (abbreviated below as "PSQ"; from Gelest, Inc.) diluted with PGME to a concentration of 60 wt % into a 20 mL pear-shaped flask, adding 8.5714 g of Titania Dispersion (1) (the solids content of the inorganic fine particles, relative to the solids content of the PSQ, being 300 parts by weight), adding 0.0300 g of a solution obtained by diluting BYK-307 (BYK-Chemie Japan KK) as the surfactant with PGME to a concentration by weight of 0.1%, then adding 5.9023 g of PGME and mixing to complete uniformity at room temperature.

Aside from using the PSQI-300 varnish thus obtained, the varnish was spin-coated onto silicon substrates or quartz substrates in the same way as in Example 1, following which baking was carried out under the same respective conditions A), B), C) and D) as in Example 1, thereby forming films.

Comparative Example 2

A varnish (abbreviated below as "PSQ2-300") having a total solids content of 8.0 wt % was obtained by weighing out 0.5000 g of a solution of PSQ (Gelest, Inc.) diluted with PGME to a concentration of 60 wt % into a 20 mL pear-shaped flask, adding 8.5714 g of Titania Dispersion (2) (the solids content of the inorganic fine particles, relative to the solids content of the PSQ, being 300 parts by weight), adding 0.0300 g of a solution obtained by diluting BYK-307 (BYK-Chemie Japan KK) as the surfactant with PGME to a concentration by weight of 0.1%, then adding 5.9023 g of PGME and mixing to complete uniformity at room temperature.

Aside from using the PSQ2-300 varnish thus obtained, the varnish was spin-coated onto silicon substrates or quartz substrates in the same way as in Example 1, following which baking was carried out under the same respective conditions A), B), C) and D) as in Example 1, thereby forming films.

Comparative Example 3

A varnish (abbreviated below as "PSQ3-300") having a total solids content of 8.0 wt % was obtained by weighing out 0.5000 g of a solution of PSQ (Gelest, Inc.) diluted with PGME to a concentration of 60 wt % into a 20 mL pear-shaped flask, adding 4.3902 g of Titania Dispersion (3) (the solids content of the inorganic fine particles, relative to the solids content of the PSQ, being 300 parts by weight), adding 0.0300 g of a solution obtained by diluting BYK-307 (BYK-Chemie Japan KK) as the surfactant with PGME to a concentration by weight of 0.1%, then adding 10.0835 g of PGME and mixing to complete uniformity at room temperature. Aside from using the PSQ3-300 varnish thus obtained, the varnish was spin-coated onto silicon substrates or quartz substrates in the same way as in Example 1, following which baking was carried out under the same respective conditions. A), B), C) and D) as in Example 1, thereby forming films.

Measurement of Refractive Index

The refractive indices at 633 nm of the films formed on silicon substrates under the various bake conditions in the respective working examples of the invention and comparative examples above were measured with an ellipsometer, and the thermal stabilities of the film refractive indices were evaluated. The results are shown in Table 1.

The thermal stability of the refractive index was evaluated by comparing the refractive indices under bake conditions B) and D) and calculating the refractive index difference (□) therebetween. A smaller refractive index difference indicates a better refractive index thermal stability. If the difference is a positive value, the refractive index obtained under bake conditions D) increases relative to that obtained under bake conditions B), whereas if the difference is a negative value, the refractive index obtained under bake conditions D) decreases relative to that obtained under bake conditions B). When this difference in the refractive indices is a negative value and the value is large, the refractive index decreases as the bake temperature rises; hence, the thermal stability of the refractive index is poor.

TABLE 1

|  | Refractive index at 633 nm | | | | Refractive index difference (Δ) |
|---|---|---|---|---|---|
|  | A) | B) | C) | D) | D)-B) |
| Example 1 | 1.7884 | 1.8202 | 1.8250 | 1.8345 | 0.0143 |
| Example 2 | 1.8028 | 1.8274 | 1.8364 | 1.8367 | 0.0093 |
| Example 3 | 1.8163 | 1.8189 | 1.8149 | 1.8049 | −0.0140 |
| Example 4 | 1.8111 | 1.8407 | 1.8456 | 1.8540 | 0.0133 |
| Example 5 | 1.8329 | 1.8610 | 1.8745 | 1.8853 | 0.0243 |
| Example 6 | 1.8573 | 1.8732 | 1.8806 | 1.8681 | −0.0051 |
| Example 7 | 1.7818 | 1.8076 | 1.8088 | 1.8150 | 0.0074 |
| Example 8 | 1.7874 | 1.7917 | 1.7854 | 1.7726 | −0.0191 |
| Example 9 | 1.7709 | 1.7566 | 1.7428 | 1.7321 | −0.0245 |
| Comparative Example 1 | 1.7794 | 1.7637 | 1.7405 | 1.7142 | −0.0495 |
| Comparative Example 2 | 1.8151 | 1.8026 | 1.7758 | 1.7526 | −0.0500 |
| Comparative Example 3 | 1.7221 | 1.7031 | 1.6858 | 1.6662 | −0.0369 |

As shown in Table 1, the films produced in Examples 1 to 9 exhibited very high refractive indices of about 1.8 at a wavelength of 633 nm, in addition, to which the thermal stabilities of the refractive indices were also high.

By contrast, in Comparative Examples 1 to 3, when the bake temperature was raised, the refractive index of the films obtained decreased, indicating that the refractive indices of these films had a poor thermal stability.

Measurement of Transmittance

The transmittances of the films produced on silicon substrates under the various bake conditions in the respective working examples and comparative examples above were measured with an ultraviolet-visible spectrophotometer. The background when measuring the transmittance was a quartz substrate not coated with a film. The transmittance was measured over a wavelength range of from 200 to 800 nm. The results of transmittance measurements for the films produced in Examples 1 to 9 and Comparative Examples 1 to 3 are shown respectively in FIGS. 2 to 13.

As shown in FIGS. 2 to 13, the transmittances were good values of at least 90% in the visible light region of from 400 to 800 nm.

Moreover, even when the bake conditions were changed, a marked decrease in the transmittance did not occur. This demonstrated that the heat-resistant transmittance was good, that the temperature margin when fabricating electronic devices is broad, and that stable films can be obtained.

Solvent Resistance

The solvent resistance test refers to a test indicating that the film obtained after the main bake is insoluble when brought into contact with a solvent. Solvent resistance is a property that is essential when the subsequent steps of recoating the film with a resist or the like and patterning are additionally carried out. In the absence of solvent resistance, the film will dissolve in the resist solution during recoating, leading to mixing of the film and the resist, as a result of which the inherent properties of the film may not be achieved.

Example 10

A solvent resistance test was carried out on the film formed on a silicon substrate under condition B) in Example 3.

The film thickness after baking was 198.4 nm. This was treated as the initial film thickness. Separate films were each independently immersed completely in propylene glycol monomethyl ether, propylene glycol monomethyl ether acetate, cyclohexanone, acetone or ethyl lactate, and left to stand 5 minutes. Next, the films were dried in air, after which the residual solvent was completely evaporated by a 1-minute bake on a 200° C. hot plate. The film thickness was then measured and compared with the initial film thickness.

As a result, letting the initial thickness of the film be 100%, the film thicknesses following immersion in the respective solvents were 100.0% for propylene glycol monomethyl ether, 100.0% for propylene glycol monomethyl ether acetate, 100.0% for cyclohexanone, 100.0% for acetone, and 100.0% for ethyl acetate. Hence, the film was found to have good solvent resistances to various types of organic solvents.

Example 11

Aside from using the film formed on a silicon substrate under condition B) in Example 6, a solvent resistance test was carried out in the same way as in Example 10. The film thickness after baking was 195.5 nm. This was treated as the initial film thickness.

Letting the initial thickness of the film be 100%, the film thicknesses following immersion in the respective solvents were 100.0% for propylene glycol monomethyl ether, 100.0% for propylene glycol monomethyl ether acetate, 100.0% for cyclohexanone, 100.0% for acetone, and 100.0% for ethyl acetate. Hence, the film was found to have good solvent resistances to various types of organic solvents.

Example 12

Aside from using the film formed on a silicon substrate under condition B) in Example 9, a solvent resistance test was carried out in the same way as in Example 10. The film thickness after baking was 194.9 nm. This was treated as the initial film thickness.

Letting the initial thickness of the film be 100%, the film thicknesses following immersion in the respective solvents were 100.0% for propylene glycol monomethyl ether, 100.0% for propylene glycol monomethyl ether acetate, 100.0% for cyclohexanone, 100.0% for acetone, and 100.0% for ethyl acetate. Hence, the film was found to have good solvent resistances to various types of organic solvents.

Comparative Example 4

A solvent resistance test was carried out on a film formed on a silicon substrate without the addition of inorganic fine particles to the 20% CHN solution of HB-TmDA45 prepared in Example 1.

That is, a film was formed by spin-coating a 20% CHN solution of HB-TmDA45 onto a silicon substrate, followed by a 1-minute bake at 100° C. and a 5-minute bake at 200° C. The film thickness after baking was 500.4 nm. This was treated as the initial film thickness. Aside from using this film, a solvent resistance test was carried out in the same way as in Example 10.

Letting the initial thickness of the film be 100%, the film thicknesses following immersion in the respective solvents were 0.0% for propylene glycol monomethyl ether, 0.0% for propylene glycol monomethyl ether acetate, 0.0% for cyclohexanone, 0.0% for acetone, and 0.0% for ethyl acetate. Hence, the solvent resistance of the film with respect to each of these organic solvents was poor.

Upon comparing the results from Examples 10 to 12 with the results from Comparative Example 4, it was found that solvent resistance emerges in hybrid films obtained by adding inorganic fine particles and baking.

Light Resistance Test

Light irradiation in the light resistance tests was carried out at the Japan Weathering Test Center. A xenon arc lamp having an illuminance of 38.7 $W/m^2$ was used as the light source.

Example 13

A light resistance test was carried out on the film formed on a quartz substrate under condition D) in Example 2. The light resistance test entailed 12.5 hours of exposure to light using the above-indicated light source. This light irradiation is equivalent to a light exposure dose of 1,000,000 lux, which is generally known to correspond to one year of outdoor exposure.

Example 14

A light resistance test like that in Example 13 was carried out on the film formed on a quartz substrate under condition D) in Example 5.

Example 15

A light resistance test like that in Example 13 was carried out on the film formed on a quartz substrate under condition D) in Example 8.

Table 2 shows the results obtained from measurements of the refractive indices of the films following 1,000,000 lux of irradiation in above Examples 13 to 15.

TABLE 2

| | Refractive index at 633 nm | |
| --- | --- | --- |
| | Before light exposure | After light exposure |
| Example 13 | 1,8367 | 1.8133 |
| Example 14 | 1.8853 | 1.8869 |
| Example 15 | 1.7726 | 1.7666 |

As shown in Table 2, the hybrid materials obtained in Examples 13 to 15 had very good light resistances, and showed little or no decrease in refractive index even with 1,000,000 lux of light exposure. In particular, the film formed in Example 14 had a good light resistance, suggesting that, among various types of titania in the form of inorganic fine particles, rutile-type titania has a superior light resistance.

As shown above, by using the inventive film-forming composition which includes a triazine ring-containing hyperbranched polymer and inorganic fine particles, it is possible to obtain a highly transparent film which has a refractive index at 633 nm of about 1.8, is resistant to changes in refractive index at bake temperatures up to 300° C., and has a good light resistance.

Moreover, because the film of the invention has solvent resistance, mixing does not occur when a resist or the like is recoated, thus enabling the stable use of semiconductor processes.

In addition, because the hybrid material can be stably formed into a varnish without a loss in the dispersion stability of the inorganic fine particles, it has an excellent storage stability. Furthermore, because the storage stability is good, this leads to stable production and stable supply during fabrication of the target electronic device, enabling costs to be reduced and throughput to be increased in device fabrication, and ultimately resulting in an improved production yield.

What is claimed is:

1. A film-forming composition characterized by comprising:
   inorganic fine particles; and
   a triazine ring-containing hyperbranched polymer which includes recurring unit structures of formula (1) below

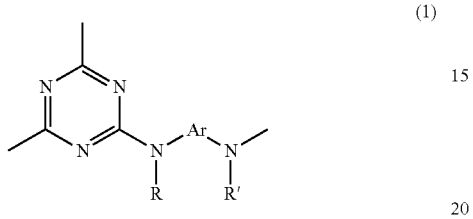

(1)

wherein R and R' are each independently a hydrogen atom or an alkyl, alkoxy, aryl or aralkyl group; and Ar is a divalent organic group which includes either of, or both, an aromatic ring and a heterocycle, wherein the hyperbranched polymer is capped on at least one end by an alkyl, aralkyl, aryl, alkylamino, alkoxysilyl-containing alkylamino, aralkylamino, arylamino, alkoxy, aralkyloxy, aryloxy, or ester group.

2. The film-forming composition according to claim 1, wherein Ar is at least one moiety selected from the group consisting of moieties of formulas (2) to (18) below

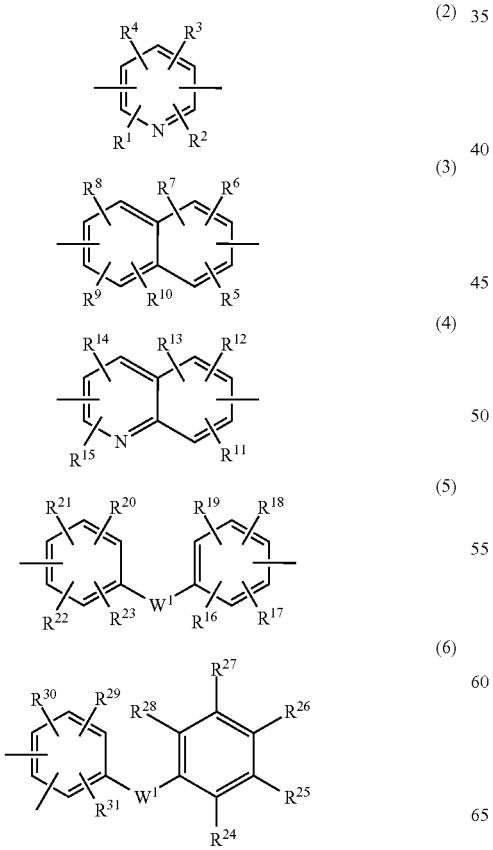

(2), (3), (4), (5), (6)

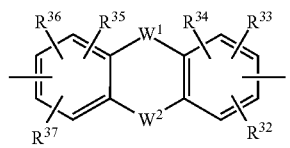

(7)

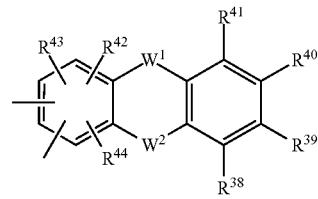

(8)

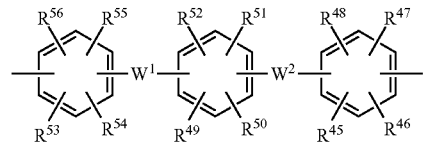

(9)

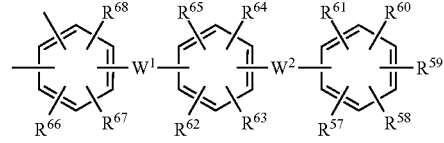

(10)

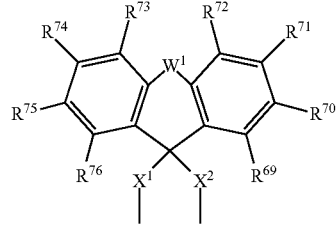

(11)

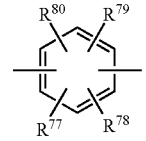

(12)

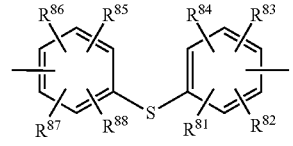

(13)

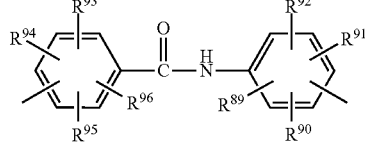

(14)

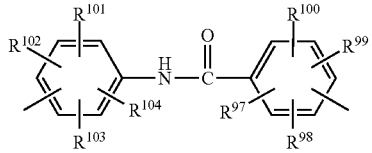

(15)

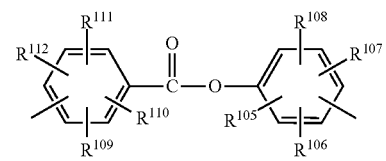
(16)

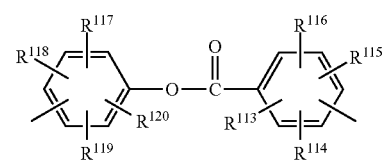
(17)

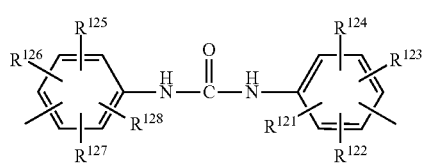
(18)

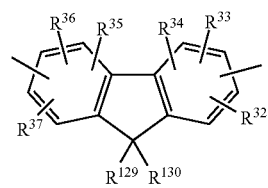
(20)

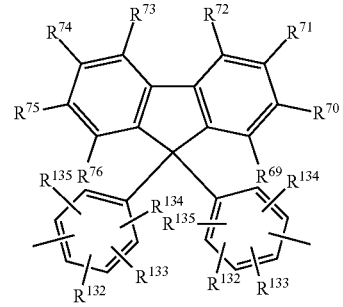
(21)

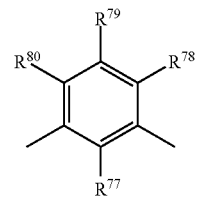
(22)

wherein $R^1$ to $R^{128}$ are each independently a hydrogen atom, a halogen atom, a carboxyl group, a sulfonyl group, an alkyl group which may have a branched structure of 1 to 10 carbons, or an alkoxy group which may have a branched structure of 1 to 10 carbons; $W^1$ and $W^2$ are each independently a single bond, $CR^{129}R^{130}$ wherein $R^{129}$ and $R^{130}$ being each independently a hydrogen atom or an alkyl group which may have a branched structure of 1 to 10 carbons, with the proviso that $R^{129}$ and $R^{130}$ may together form a ring, C=O, O, S, SO, $SO_2$ or $NR^{131}$ wherein $R^{131}$ being a hydrogen atom or an alkyl group which may have a branched structure of 1 to 10 carbons; and $X^1$ and $X^2$ are each independently a single bond, an alkylene group which may have a branched structure of 1 to 10 carbons, or a group of formula (19) below

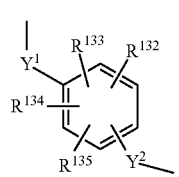
(19)

$R^{132}$ to $R^{135}$ being each independently a hydrogen atom, a halogen atom, a carboxyl group, a sulfonyl group, an alkyl group which may have a branched structure of 1 to 10 carbons, or an alkoxy group which may have a branched structure of 1 to 10 carbons; and $Y^1$ and $Y^2$ being each independently a single bond or an alkylene group which may have a branched structure of 1 to 10 carbons.

3. The film-forming composition according to claim 2, wherein Ar is at least one moiety selected from the group consisting of moieties of formulas (5) to (12) and moieties of formulas (14) to (18).

4. The film-forming composition according to claim 2, wherein Ar is at least one moiety selected from the group consisting of moieties of formulas (20) to (22) below wherein $R^{32}$ to $R^{37}$, $R^{69}$ to $R^{80}$, $R^{129}$, $R^{130}$ and $R^{132}$ to $R^{135}$ are as defined above.

5. The film-forming composition according to claim 1, wherein the recurring unit structure has formula (23) below

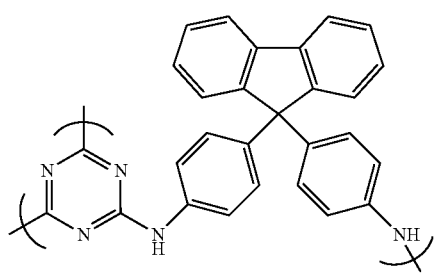
(23)

6. The film-forming composition according to claim 1, wherein the recurring unit structure has formula (24) below

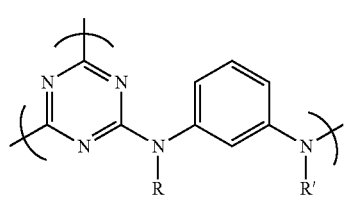
(24)

wherein R and R' are as defined above.

7. The film-forming composition according to claim 6, wherein the recurring unit structure has formula (25) below

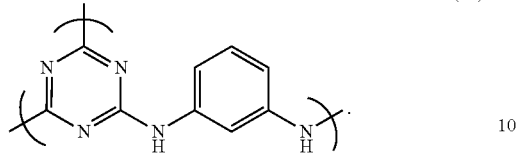
(25)

8. The film-forming composition according to claim 1, wherein the hyperbranched polymer has at least one terminal triazine ring which is capped by an alkyl, aralkyl, aryl, alkylamino, alkoxysilyl-containing alkylamino, aralkylamino, arylamino, alkoxy, aralkyloxy, aryloxy or ester group.

9. The film-forming composition according to claim 1, wherein the inorganic fine particles are an oxide, sulfide or nitride of one or more metal selected from the group consisting of Be, Al, Si, Ti, V, Fe, Cu, Zn, Y, Zr, Nb, Mo, In, Sn, Sb, Ta, W, Pb, Bi and Ce.

10. The film-forming composition according to claim 9, wherein the inorganic fine particles have a primary particle size of 2 to 50 nm and are colloidal particles of an oxide of one or more metal selected from the group consisting of Be, Al, Si, Ti, V, Fe, Cu, Zn, Y, Zr, Nb, Mo, In, Sn, Sb, Ta, W, Pb, Bi and Ce.

11. The film-forming composition according to claim 9, wherein the inorganic fine particles are surface-treated with an organosilicon compound.

* * * * *